(12) United States Patent
Liao et al.

(10) Patent No.: US 12,720,776 B2
(45) Date of Patent: Aug. 25, 2026

(54) DEEP TRENCH RESISTOR STRUCTURE AND METHODS OF FORMING THE SAME

(71) Applicant: TAIWAN SEMICONDUCTOR MANUFACTURING COMPANY, LTD., Hsinchu (TW)

(72) Inventors: Shih-Yu Liao, Hsinchu City (TW); Chung-Liang Cheng, Changhua County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 347 days.

(21) Appl. No.: 18/616,513

(22) Filed: Mar. 26, 2024

(65) Prior Publication Data

US 2025/0107149 A1 Mar. 27, 2025

Related U.S. Application Data

(60) Provisional application No. 63/540,083, filed on Sep. 24, 2023.

(51) Int. Cl.

*H10D 1/40* (2025.01)
*H10D 30/00* (2025.01)
*H10D 30/01* (2025.01)

(52) U.S. Cl.

CPC ............ *H10D 1/40* (2025.01); *H10D 30/019* (2025.01); *H10D 30/501* (2025.01)

(58) Field of Classification Search

CPC ............................................... H10D 1/40–476

See application file for complete search history.

(56) References Cited

U.S. PATENT DOCUMENTS

2007/0158725 A1* 7/2007 Cheng .................... H10D 1/665 257/E21.396
2020/0194599 A1* 6/2020 Phoa ...................... H10D 64/23
2023/0097616 A1 3/2023 Huang et al.

* cited by examiner

*Primary Examiner* — Daniel P Shook
(74) *Attorney, Agent, or Firm* — NZ Carr Law Office

(57) ABSTRACT

A deep trench resistor structure and methods of forming the same are described. The structure includes a first trench located in a first dielectric material, a first layer disposed over the first dielectric material, a second layer disposed on the first layer, a second dielectric material disposed over the second layer, and a tunable device in contact with the first layer. The tunable device includes a semiconductor-containing layer in contact with the first layer, a dielectric layer disposed on the semiconductor-containing layer, and a metal-containing layer disposed on the dielectric layer.

20 Claims, 25 Drawing Sheets

DEEP TRENCH RESISTOR STRUCTURE AND METHODS OF FORMING THE SAME

CROSS-REFERENCE TO RELATED APPLICATIONS

This application claims priority to U.S. Provisional Application No. 63/540,083, filed on Sep. 24, 2023, the contents of which are hereby incorporated by reference in their entirety.

BACKGROUND

An integrated passive device (IPD) is a collection of one or more passive devices integrated on a semiconductor substrate. Passive devices may include, for example, capacitors, resistors, inductors, and so on. IPDs are formed using semiconductor manufacturing processes and are packaged as integrated circuits (ICs). This leads to reduced size, reduced cost, and increased functional density compared to discrete passive devices. IPDs find application with, among things, mobile devices and application processors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-11A are cross-sectional side views of various stages of manufacturing a deep trench resistor structure, in accordance with some embodiments.

FIGS. 1B-11B are top views of various stages of manufacturing the deep trench resistor structure, in accordance with some embodiments.

FIGS. 13A-20A are cross-sectional side views of various stages of manufacturing the deep trench resistor structure, in accordance with alternative embodiments.

FIGS. 13B-20B are top views of various stages of manufacturing the deep trench resistor structure, in accordance with alternative embodiments.

FIGS. 23A and 23B are cross-sectional side views of a semiconductor device structure including the deep trench resistor structure, in accordance with some embodiments.

DETAILED DESCRIPTION

Figures 1A, 1B:
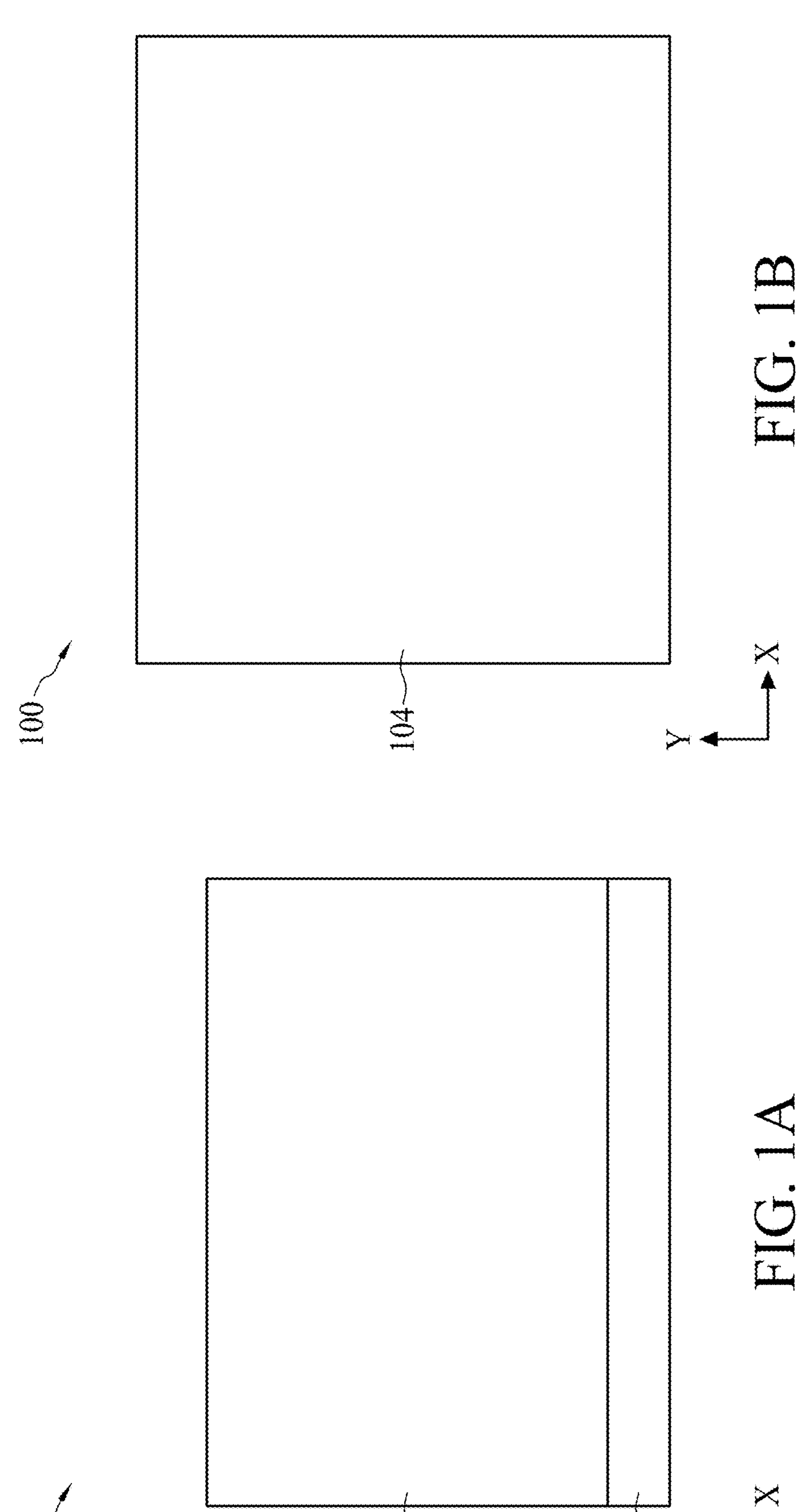

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “on,” “top,” “upper” and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated passive device (IPD) may include a substrate and a deep trench resistor (DTR) disposed over the substrate. The DTR may increase the device density. In addition, the resistance of the DTR may not be temperature dependent. In some embodiments, the DTR may include a first layer with positive temperature coefficient of resistance (TCR) and a second layer with negative TCR. Furthermore, to achieve pseudo zero TCR performance of the DTR, a tunable device is connected to the DTR. The tunable device can be used to tune the resistance of the DTR.

FIGS. 1A-11A are cross-sectional side views of various stages of manufacturing a deep trench resistor (DTR) structure 100, in accordance with some embodiments. FIGS. 1B-11B are corresponding top views of the various stages of manufacturing the DTR structure 100 of FIGS. 1A-11A, in accordance with some embodiments. It is understood that additional operations can be provided before, during, and after processes shown by FIGS. 1A-11B, and some of the operations described below can be replaced or eliminated, for additional embodiments of the method. The order of the operations/processes is not limiting and may be interchangeable.

As shown in FIGS. 1A and 1B, the DTR structure includes a dielectric material 104 deposited on an etch stop layer 102. In some embodiments, the dielectric material 104 is an intermetal dielectric (IMD) layer, and the dielectric material 104 and the etch stop layer 102 are part of an interconnect structure disposed over a substrate having a plurality of devices formed thereon. The dielectric material 104 may include any suitable dielectric material, such as $SiO_x$, $SiO_xC_yH_z$, or $SiO_xC_y$, where x, y and z are integers or non-integers. In some embodiments, the dielectric material 104 includes a low-k dielectric material having a k value less than that of silicon oxide. In some embodiments, the dielectric material 104 has a k value ranging from about 1.5 to about 3.9. The dielectric material 104 may be deposited by any suitable process, such as chemical vapor deposition (CVD), plasma enhanced chemical vapor deposition (PECVD), or atomic layer deposition (ALD). The etch stop layer 102 may include any suitable material, such as SiN, AlN, or $Al_2O_3$. The etch stop layer 102 may be formed by any suitable process. In some embodiments, the etch stop layer 102 is a conformal layer and is formed by ALD.

Figure 2B:
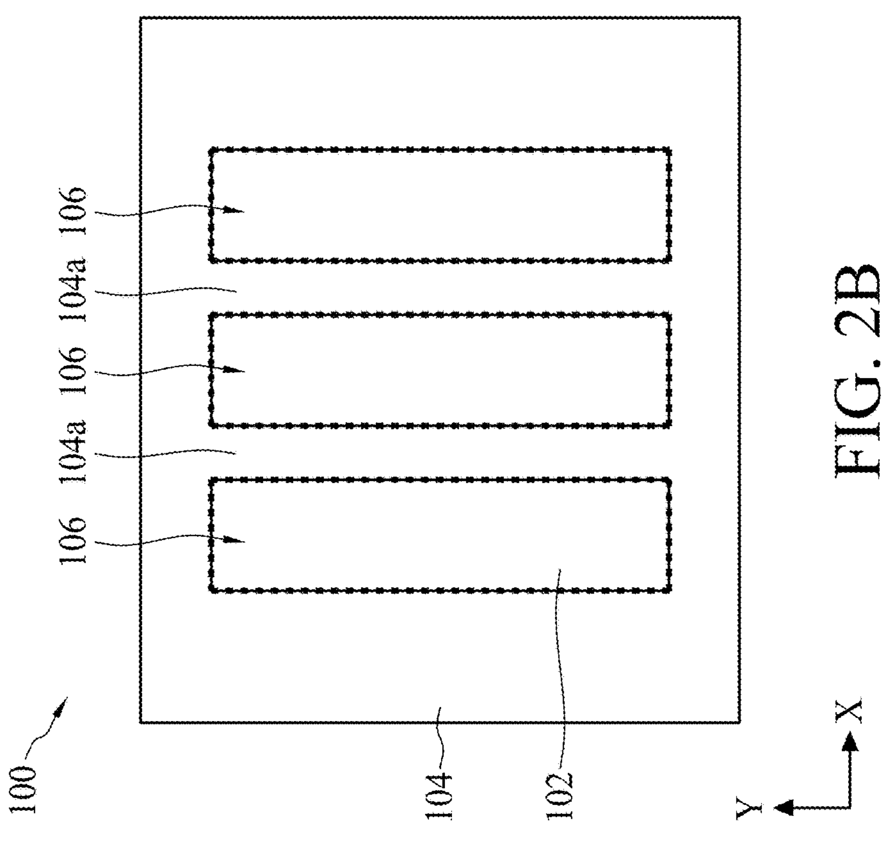
Figure 2A:
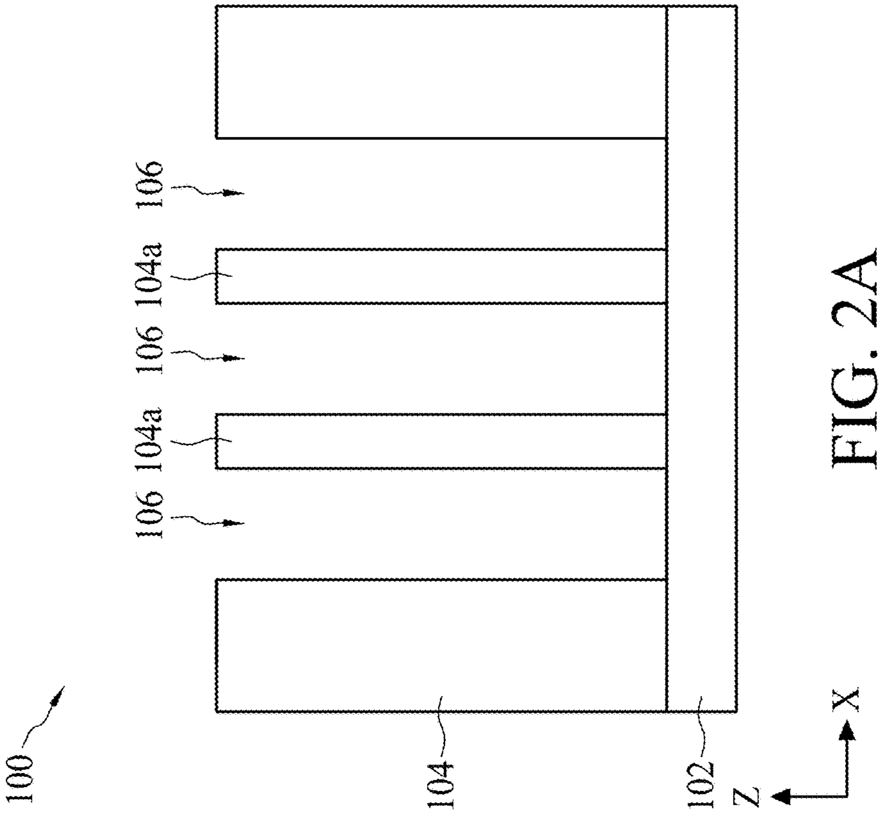

As shown in FIGS. 2A and 2B, trenches 106 are formed in the dielectric material 104 to expose portions of the etch stop layer 102. The trenches 106 may be formed using any suitable method. In some embodiments, the trenches 106 are formed using photolithography and etching processes. A resist layer (not shown) is patterned by the photolithography process, and the pattern of the resist layer is transferred to the dielectric material 104 by the etching process to form the trenches 106. The etching process may be a dry etching process, a wet etching process, or a combination thereof. The trenches are separated by portions 104*a* of the dielectric material 104. Portions of the etch stop layer 102 are exposed at the bottom of the trenches 106, as shown in FIGS. 2A and 2B. The trench 106 may have a dimension along the X direction ranging from about 10 nm to about 1 micron and a dimension along the Y direction ranging from about 10 nm to about 1 micron. In some embodiments, the dimension along the Y direction is substantially greater than the dimension along the X direction, as shown in FIG. 2B. In some embodiments, the depth of the trench 106 along the Z direction ranging from about 100 nm to about 10 microns.

Figure 3B:
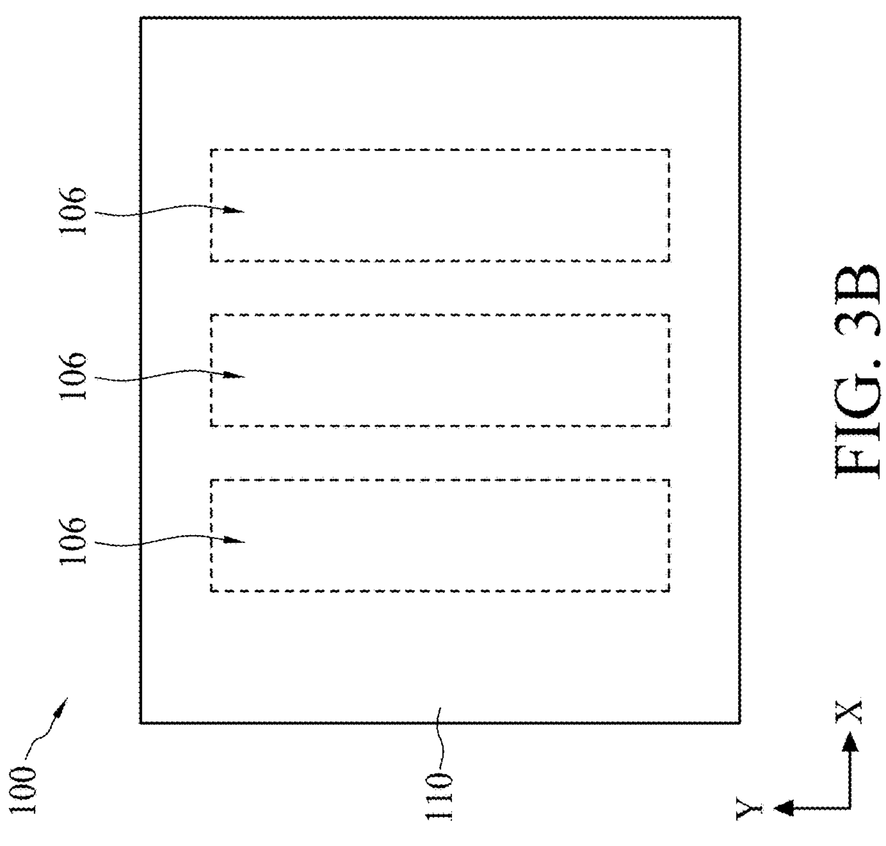
Figure 3A:
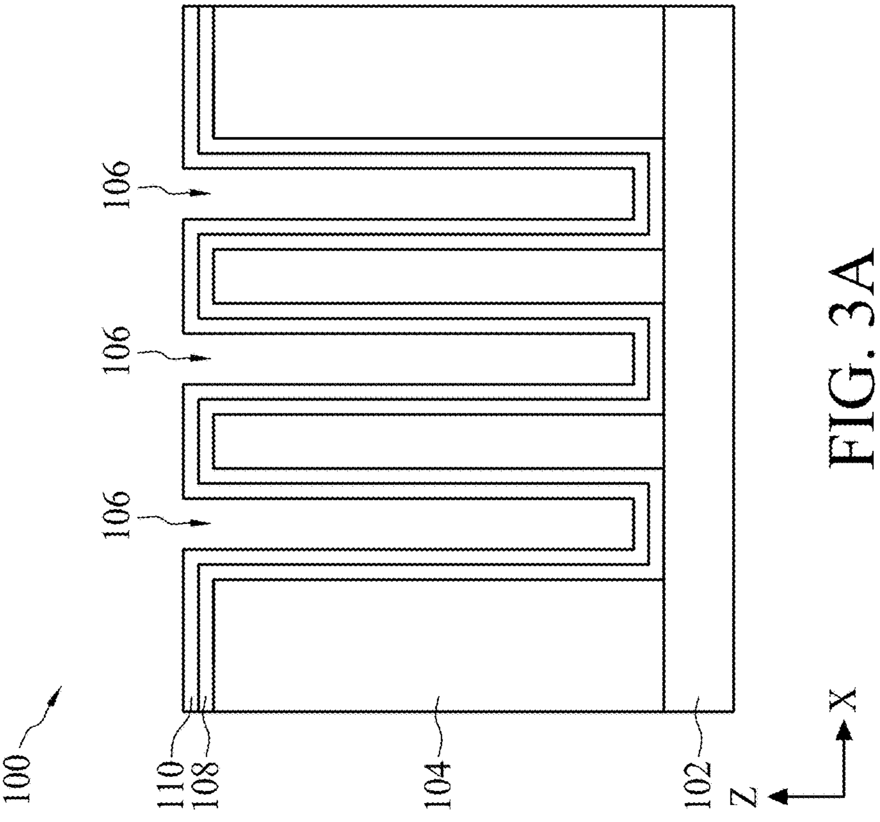

As shown in FIGS. 3A and 3B, a first layer 108 is deposited on the dielectric material 104 and in the trenches 106, and a second layer 110 is deposited on the first layer 108. In some embodiments, the first layer 108 includes a first material having positive TCR, and the second layer 110 includes a second material having negative TCR. In some embodiments, the first layer 108 includes the second material, and the second layer 110 includes the first material. The first material may include a metal, such as Au, Pt, Cr, Ti, Ta, Cu, Ag, Co, Ni, Fe, Pb, Al, Ru, $RuO_2$, Ir, $IrO_2$, Mo, W, TiN, TaN, WN, MoN, TiAl, TiAlC, TaAl, TaAlC, TiAlN, TaAlN, metal alloy, metal oxide, metal nitride, metal carbide, or other suitable metal-containing material. The second material may include a semiconductor, such as Si, Ge, SiGe, GaN, InN, InGaN, GaAs, InAs, InGaAs, InGaZnO, CuO, InZnO, GaZnO, and compounds thereof. In some embodiments, the semiconductor is a doped semiconductor, and dopant includes B, P, N, O, C, or other suitable dopants. In some embodiments, the semiconductor is a polycrystalline semiconductor. The first and second layers 108, 110 may be formed by any suitable method. In some embodiments, the first and second layers 108, 110 are conformal layers and are formed by a conformal process, such as ALD. The first and second layers 108, 110 may form one or more DTRs. In some embodiments, a single layer, such as the first layer 108 or the second layer 110, forms the one or more DTRs. In some embodiments, as shown in FIG. 3A, the first layer 108 and the second layer 110 (or the first layer 108 or the second layer 110) do not fill the trenches 106.

Figure 4B:
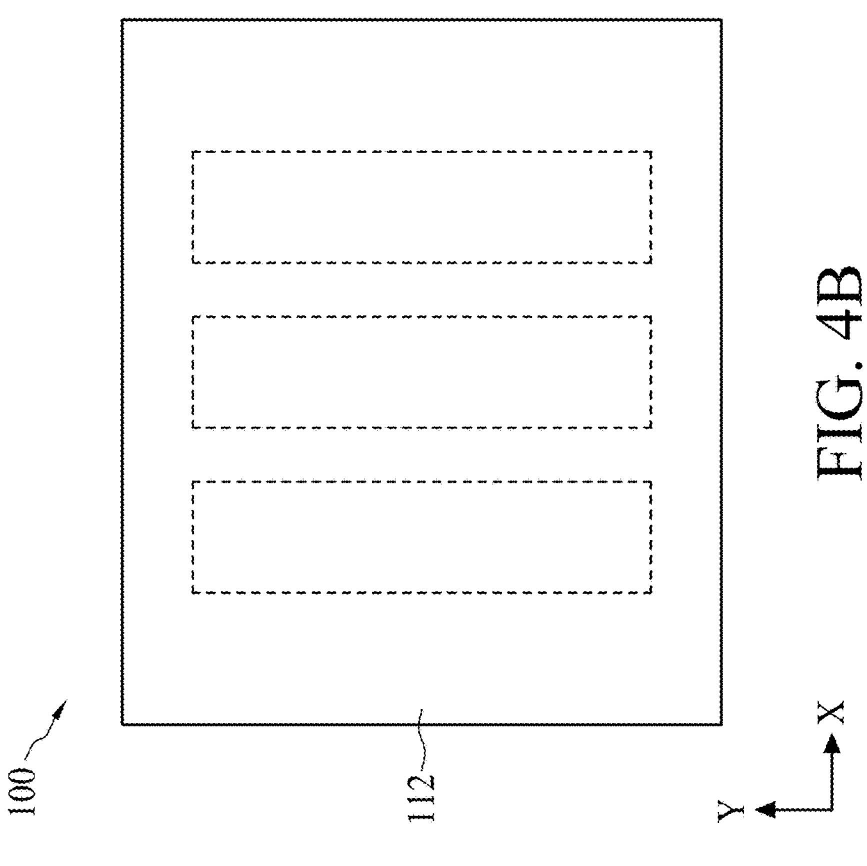
Figure 4A:
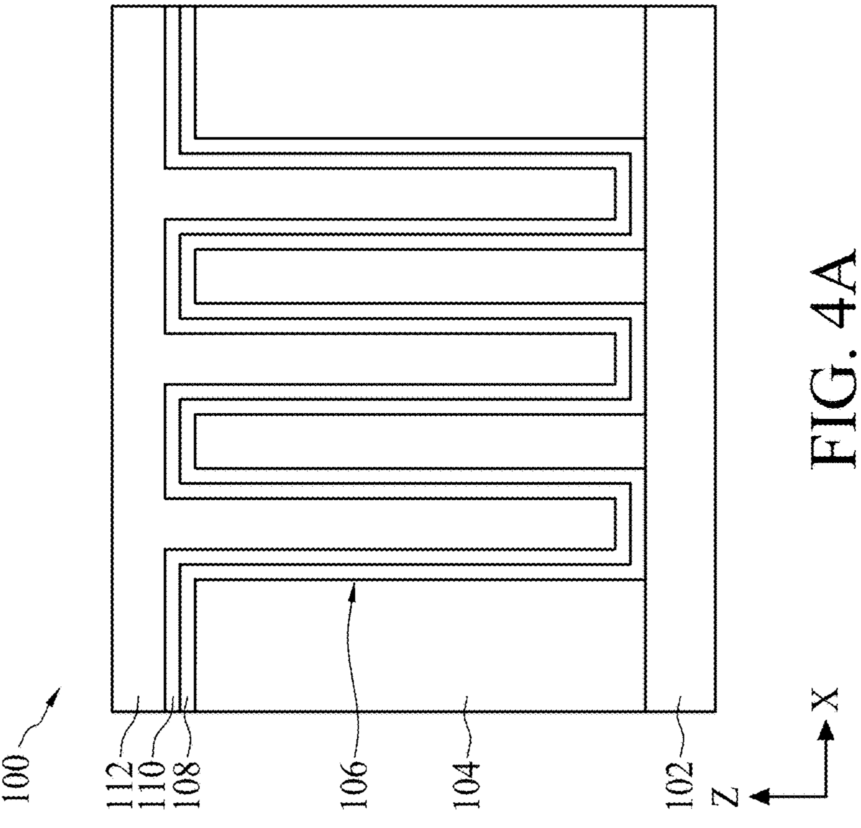

As shown in FIGS. 4A and 4B, a dielectric material 112 is formed on the second layer 110 and fills the trenches 106. The dielectric material 112 may be any suitable dielectric material. In some embodiments, the dielectric material 112 includes SiN. In some embodiments, the dielectric material 112 may be formed by a conformal process, such as ALD, in order to avoid forming seams or voids in the trenches 106.

Figure 5B:
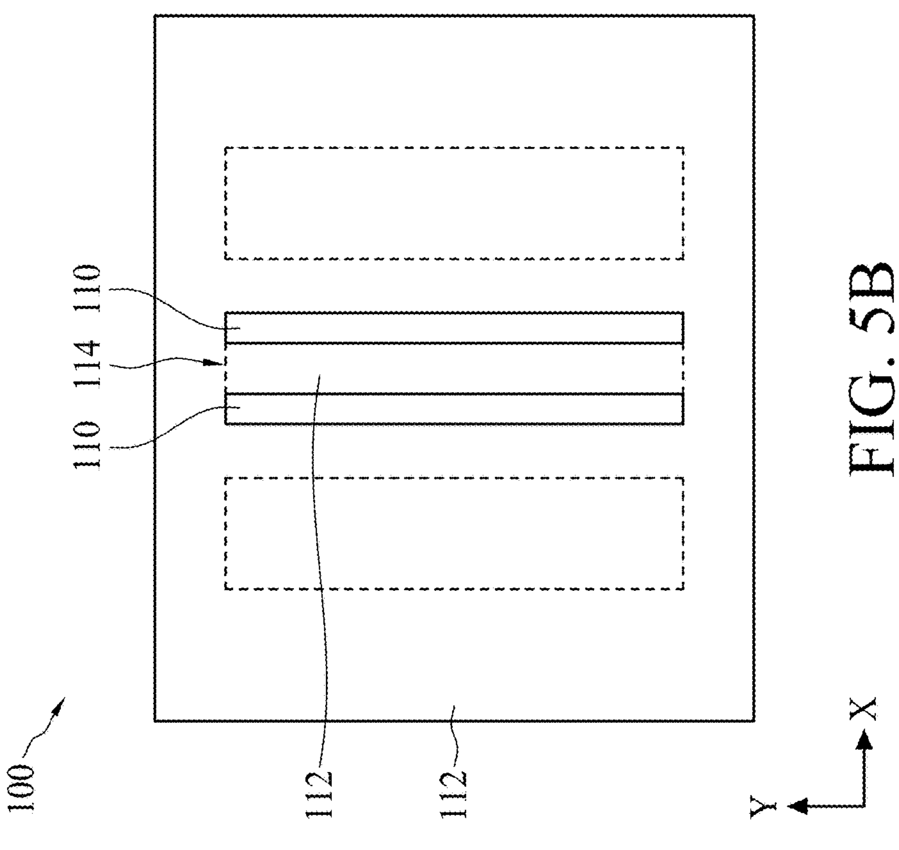
Figure 5A:
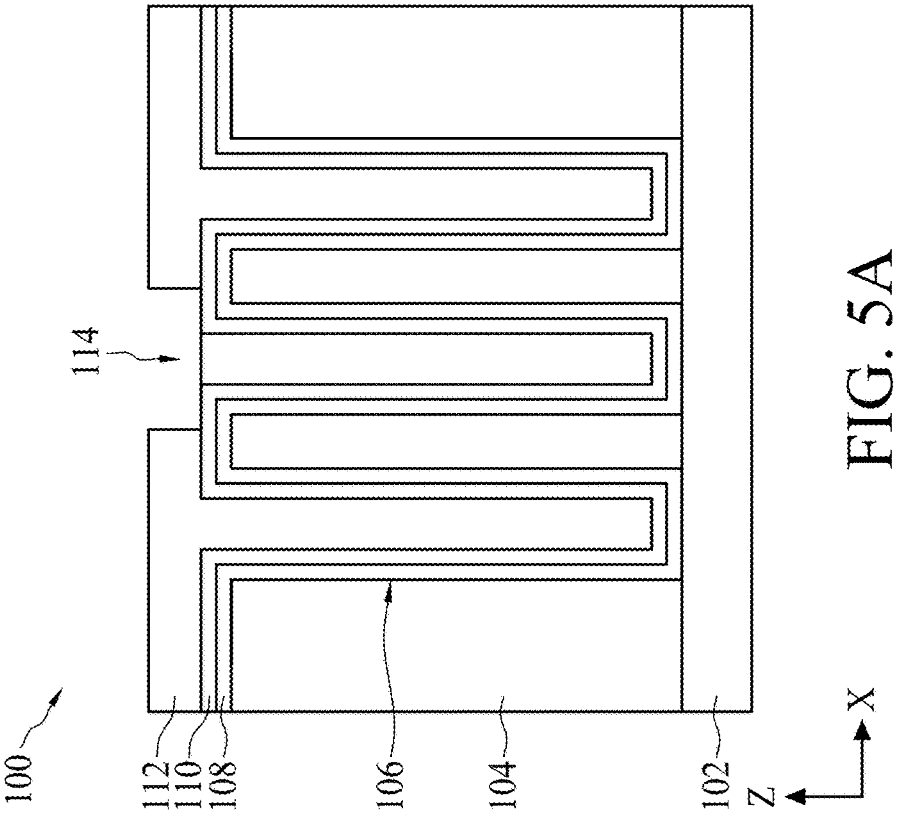

As shown in FIGS. 5A and 5B, an opening 114 is formed in the dielectric material 112. In some embodiments, the opening 114 is a trench. The opening 114 may have a dimension along the X direction substantially greater than the dimension of the trench 106 along the X direction and a dimension along the Y direction substantially the same as the dimension of the trench 106 along the Y direction, as shown in FIGS. 5A and 5B. In some embodiments, portions of the second layer 110 and a portion of the dielectric material 112 disposed between the portions of the second layer 110 are exposed in the opening 114. The opening 114 may be formed by any suitable method. In some embodiments, the opening 114 is formed using photolithography and etching processes. A resist layer (not shown) is patterned by the photolithography process, and the pattern of the resist layer is transferred to the dielectric material 112 by the etching process to form the opening 114. The etching process may be a dry etching process, a wet etching process, or a combination thereof. In some embodiments, portions of the second layer 110 are removed by the etching process, and the thickness of the portions of the second layer 110 exposed in the opening 114 may be substantially less than the thickness of the portions of the second layer 110 covered by the dielectric material 112. In some embodiments, the dimension of the opening 114 along the X direction is less than the sum of the dimensions of the two portions 104*a* of the dielectric material 104 and the trench 106 along the X direction. In some embodiments, the dimension of the opening 114 along the X direction is greater than the sum of the dimensions of the two portions 104*a* of the dielectric material 104 and the trench 106 along the X direction. In other words, the opening 114 may extend over one or more trenches 106.

Figures 6A, 6B:
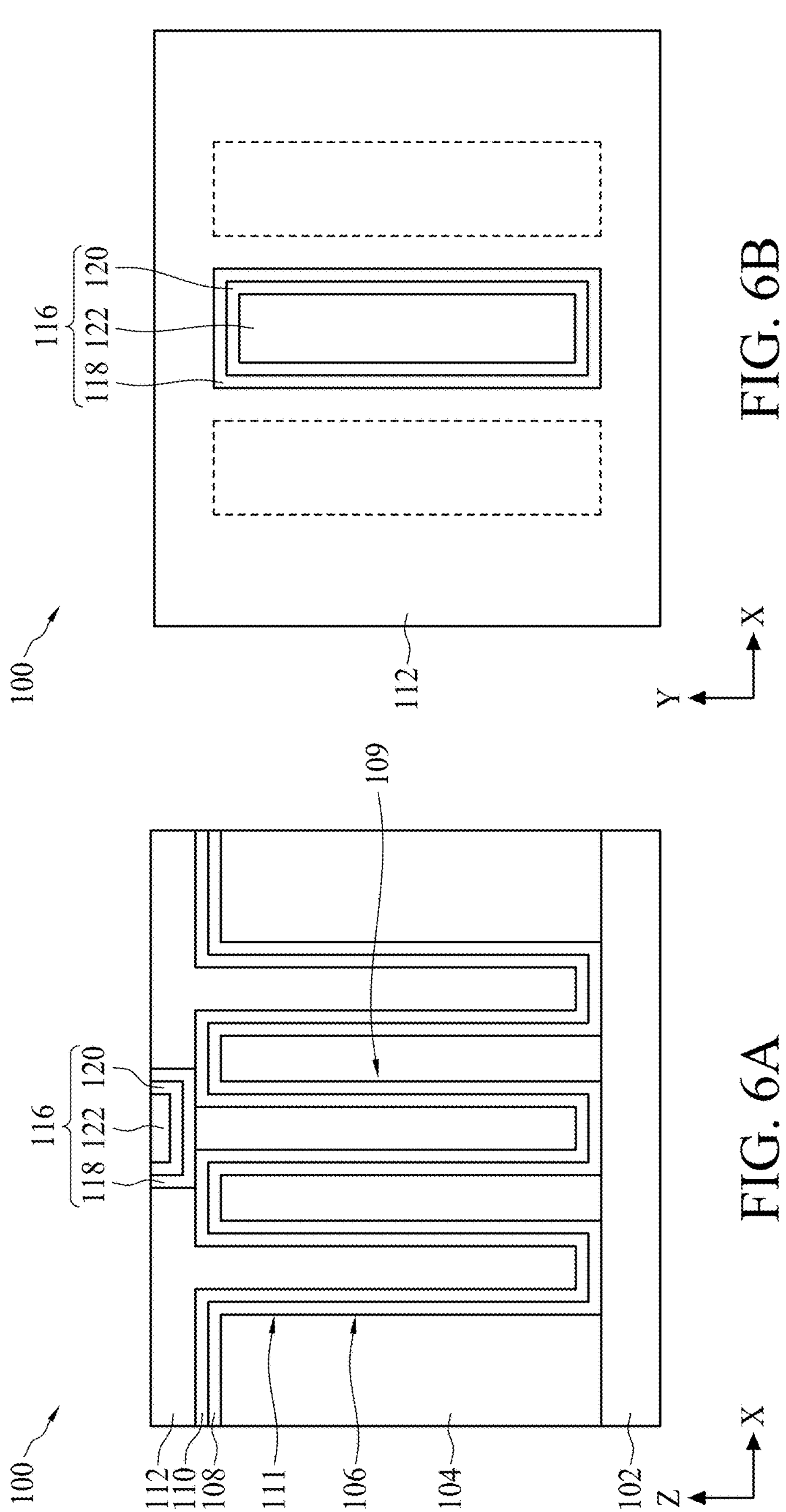

As shown in FIGS. 6A and 6B, a tunable device 116 is formed in the opening 114. In some embodiments, the tunable device 116 includes a first layer 118, a second layer 120 deposited on the first layer 118, and a third layer 122 deposited on the second layer 120. The first layer 118 may be a semiconductor-containing layer. In some embodiments, the first layer 118 includes Si, SiGe, InGaZnO, InGaO, InGaSnO, CuO, SnO, NiO, CrO, GaAs, InGaAs, InP, InGaP, GaP, GaN, InGaN, or compounds thereof. The first layer 118 may be deposited by any suitable method. In some embodiments, the first layer 118 is a conformal layer and is formed by a conformal process, such as ALD. The first layer 118 may be deposited on the dielectric material 112 and in the opening 114. Next, the second layer 120 is deposited on the first layer 118 over the dielectric material 112 and in the opening 114. The second layer 120 may be a dielectric layer. In some embodiments, the second layer 120 includes SiN, $SiO_x$, SiON, SiCN, SiOCN, $HfO_2$, HfZrO, HfAlO, AlOx, TaOx, HfTaO, $TiO_2$, HfTiO, TaAlO, ZrAlO, or compounds thereof. The second layer 120 may be deposited by any suitable method. In some embodiments, the second layer 120 is a conformal layer and is formed by a conformal process, such as ALD. Next, the third layer 122 is deposited on the second layer 120 over the dielectric material 112 and in the opening 114. The third layer 122 may be a metal-containing layer. In some embodiments, the third layer 122 includes Au, Pt, Cr, Ti, Ta, Cu, Ag, Co, Ni, Fe, Pb, Al, Ru, $RuO_2$, Ir, $IrO_2$, Mo, W, TiN, TaN, WN, MON, TiAl, TiAlC, TaAl, TaAlC, TiAlN, TaAlN, or compounds thereof. The third layer 122 may be deposited by any suitable method. In some embodiments, the third layer 122 is a conformal layer and is formed by a conformal process, such as ALD. After the deposition of the first, second, and third layers 118, 120, 122, a planarization process, such as a CMP process, may be performed to expose the dielectric material 112. Portions of the first, second, and third layers 118, 120, 122 formed on the dielectric material 112 may be removed by the planarization process.

In some embodiments, the first layer 108 and the second layer 110 form the DTR. The DTR includes a first segment 109 disposed in one or more trenches 106 under the tunable device 116 and a second segment 111 disposed in one or more trenches 106 not under the tunable device 116. Thus, the resistance of the DTR is the sum of the resistance of the first segment 109 and the second segment 111. The resistance of the first segment 109 may be tunable by the tunable device 116.

Even with the first layer 108 and the second layer 110 being positive TCR and negative TCR (or vice versa), the resistance of the DTR may still change based on temperature. In other words, the resistance of the DTR including the first and second layers 108, 110 may still be temperature dependent. The tunable device 116 helps to reduce the temperature dependency of the resistance of the DTR. In some embodiments, the third layer 122 functions as a control gate electrode and the first layer 118 functions as a channel. The portions of the second layer 110 in contact with edge portions of the tunable device 116 may function as source/drain regions. As a result, the tunable device 116 may be a transistor that is connected to the first segment 109 of the DTR in parallel. In some embodiments, when the tunable device 116 is turned off, the first layer 118 is an insulator having a resistance substantially greater than that of the first segment 109, and the current flows from the second segment 111 to the first segment 109. When the tunable device 116 is partially turned on, a first voltage is applied to the tunable device 116, and the first layer 118 has a resistance substantially the same as that of the first segment 111 of the DTR. Thus, the current flows from the second segment 111 to both the first segment 109 and the first layer 118. As a result, the resistance of the first segment 109 is reduced. When the tunable device 116 is fully turned on, a second voltage substantially greater than the first voltage is applied to the tunable device 116, and the first layer 118 has a resistance substantially smaller than that of the first segment 109, and the current flows from the second segment 111 to the first layer 118, completely bypassing the first segment 109. As a result, the resistance of the first segment 109 becomes zero. In some embodiments, the resistance of the DTR increases as temperature increases. The tunable device 116 can be turned on to reduce the resistance of a segment of the DTR that is connected in parallel thereof, such as the first segment 109, to keep the resistance of the DTR substantially constant as the temperature increases. The details of how the tunable device 116 tunes the resistance of the DTR at different temperatures are described in FIGS. 12A and 12B.

Figure 12B:
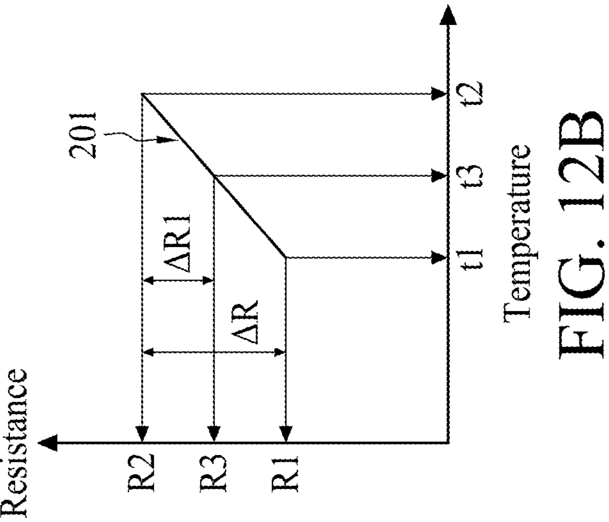
FIG. 12B is a chart showing a relationship between temperature and resistance of the deep trench resistor of FIG. 12A, in accordance with some embodiments.
Figure 12A:
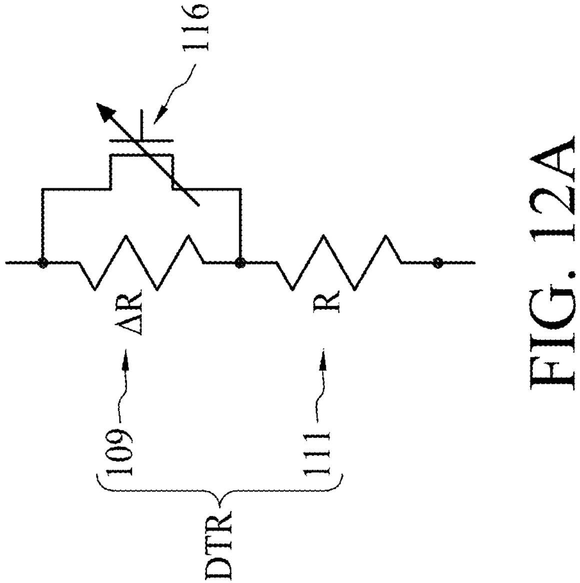
FIG. 12A is a circuit diagram of a deep trench resistor and a tunable device, in accordance with some embodiments.

FIG. 12A is a circuit diagram of the DTR and the tunable device 116 and FIG. 12B is a chart showing a relationship between temperature and resistance of the DTR. As described above, in some embodiments, the DTR may be a two-layer structure including the first layer 108 and the second layer 110. In some embodiments, the DTR is a single layer including the first layer 108 or the second layer 110. As shown in FIG. 12*a*, the tunable device 116 and the first segment 109 of the DTR are connected in parallel. The first segment 109 of the DTR has a resistance AR at a temperature t1. The second segment 111 of the DTR has a resistance R at the temperature t1. As shown in FIG. 12B, the temperature and the resistance of the second segment 111 of the DTR has a linear relationship 201. For example, at the temperature t1, the resistance R of the second segment 111 of the DTR is equal to R1. At a temperature t2, the resistance R of the second segment 111 of the DTR is equal to R2. At a temperature t3, the resistance R of the second segment 111 of the DTR is equal to R3. Thus, at temperature t1, the resistance of the DTR is equal to R1 plus AR, which is equal to R2, as shown in FIG. 12B. The tunable device 116 is turned off at temperature t1. At the temperature t3, the tunable device 116 is partially turned on, so the resistance of the first segment 109 is equal to a percentage of AR, which is AR1. As a result, the resistance of the DTR is equal to R3 plus AR1, which is equal to R2. At the temperature t2, the tunable device 116 is completely turned on, so the resistance of the first segment 109 is equal to zero. As a result, the resistance of the DTR is equal to R2. By utilizing the tunable device 116, the resistance of the DTR, which is the sum of the resistance of the first segment 109 and the resistance of the second segment 111, remains substantially constant (e.g., at R2) as the temperature increases from t1 to t2.

Figures 7A, 7B:
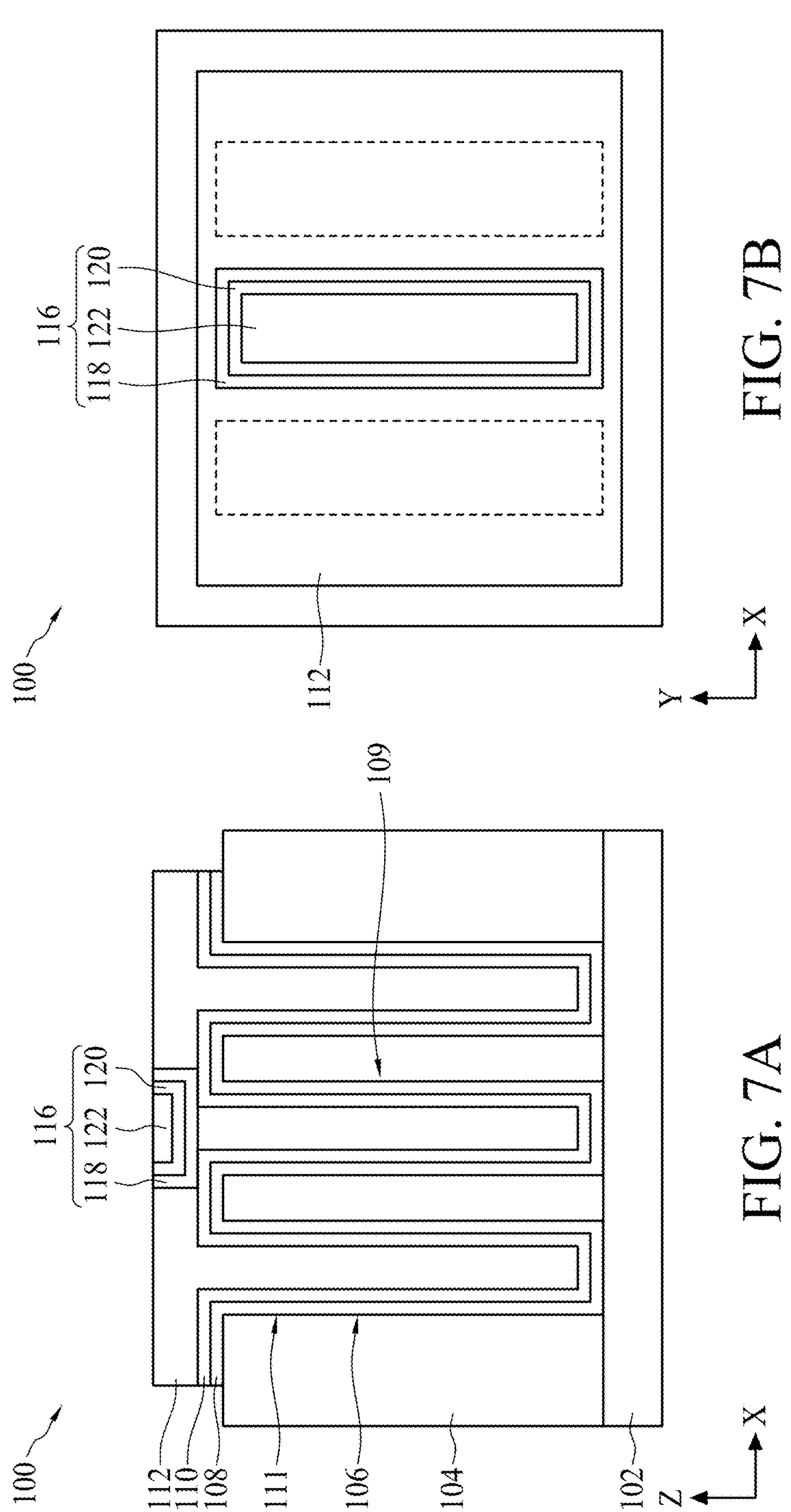
Figures 8A, 8B:
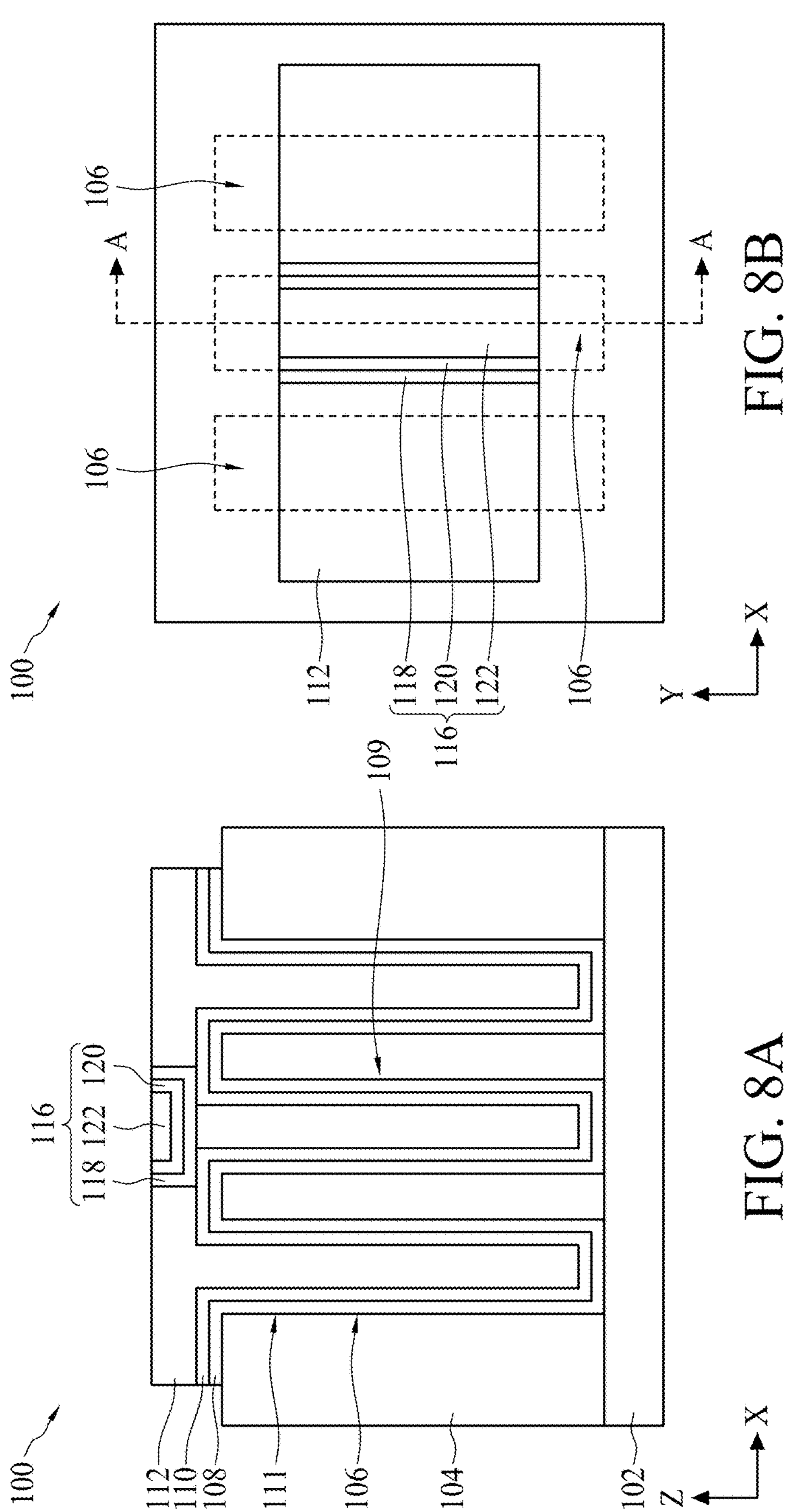
Figure 8C:
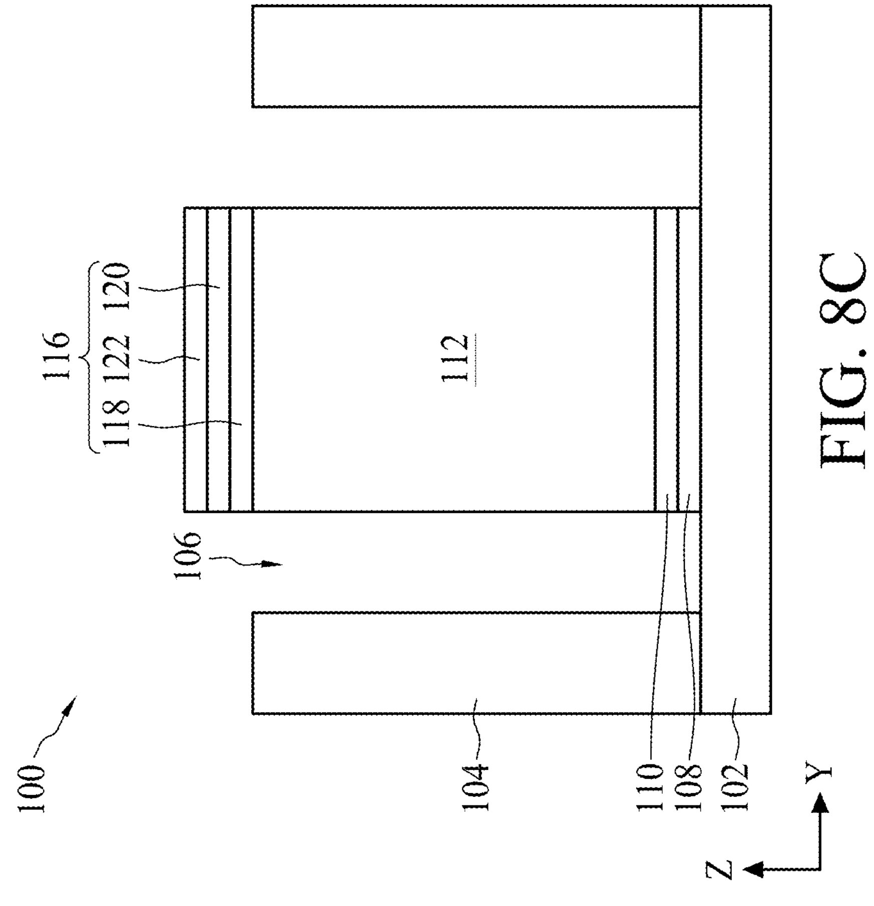
FIGS. 8C and 9C are cross-sectional side views of the DTR structure 100 taken along line A-A of FIG. 8B, in accordance with some embodiments.

Referring to FIGS. 7A and 7B, after the formation of the tunable device 116, portions of the dielectric material 112, the second layer 110, and the first layer 108 are removed along the X direction. In other words, the dielectric material 112, the second layer 110, and the first layer 108 are recessed along the X direction. In some embodiments, a first mask layer (not shown) is formed on the remaining portion of the dielectric material 112 and the tunable device 116, and multiple etching processes are performed to remove the exposed portions of the dielectric material 112 and the portions of the first and second layers 108, 110 located under the exposed portions of the dielectric material 112. Next, as shown in FIGS. 8A and 8B, portions of the dielectric material 112, the second layer 110, the first layer 108, and the tunable device 116 are removed along the Y direction. In other words, the dielectric material 112, the second layer 110, the first layer 108, and the tunable device 116 are recessed along the Y direction. If the dielectric material 112, the second layer 110, the first layer 108, and the tunable device 116 are not recessed along the Y direction, a current may flow around the tunable device 116. As a result, the tunable device 116 cannot tune the resistance of the DTR. In some embodiments, the dimension of the tunable device 116 along the Y direction is substantially the same or greater than the dimension of the first and second layers 108, 110 along the Y direction. FIG. 8C is a cross-sectional side view of the DTR structure 100 taken along line A-A of FIG. 8B. As shown in FIGS. 8B and 8C, portions of the dielectric material 112, the second layer 110, the first layer 108, and the tunable device 116 located in the trenches 106 may be removed. As a result, each trench 106 includes portions of the first layer 108, the second layer 110, and the dielectric material 112 located between two openings, and the tunable device 116 is disposed on the dielectric material 112. The portions of the dielectric material 112, the second layer 110, the first layer 108, and the tunable device 116 may be removed along the Y direction by any suitable method. In some embodiments, a second mask layer (not shown) is formed on the remaining portion of the dielectric material 112 and the tunable device 116, and multiple etching processes are performed to remove the exposed portions of the dielectric material 112, the tunable device 116, and the portions of the first and second layers 108, 110 located under the exposed portions of the dielectric material 112 and the tunable device 116. The etching process may be a dry etching process, a wet etching process, or a combination thereof. In some embodiments, the recessing of the dielectric material 112, the second layer 110, and the first layer 108 along the X direction and the recessing of the dielectric material 112, the second layer 110, the first layer 108, and the tunable device 116 along the Y direction are performed by a single photolithography process with multiple etching processes. In other words, a single mask layer (not shown), instead of the first and second mask layers, is formed on the remaining portions of the dielectric material 112 and the tunable device 116, and multiple etching processes are performed to remove portions of the dielectric material 112, the second layer 110, the first layer 108, and the tunable device 116.

Figures 9A, 9B:
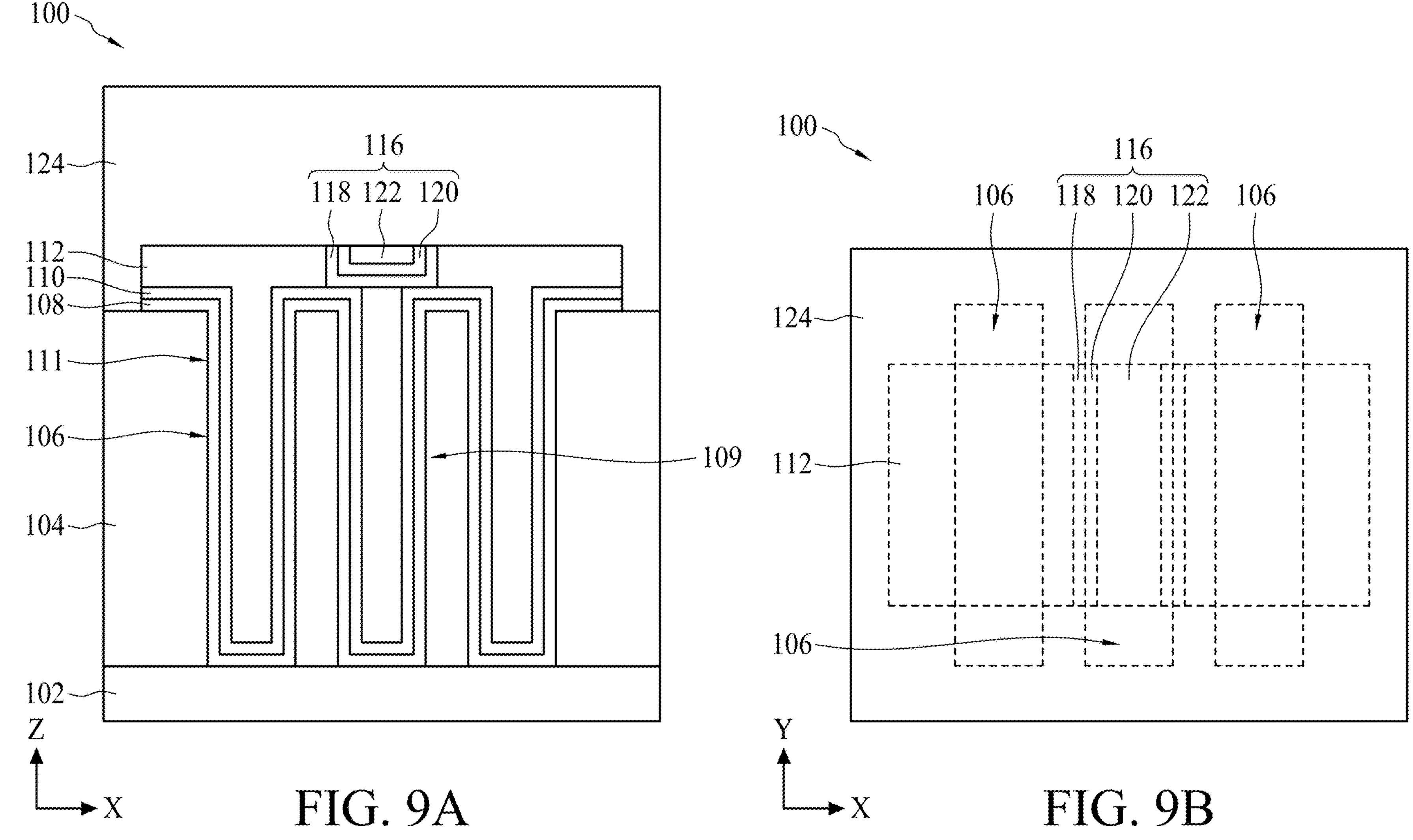
Figure 9C:
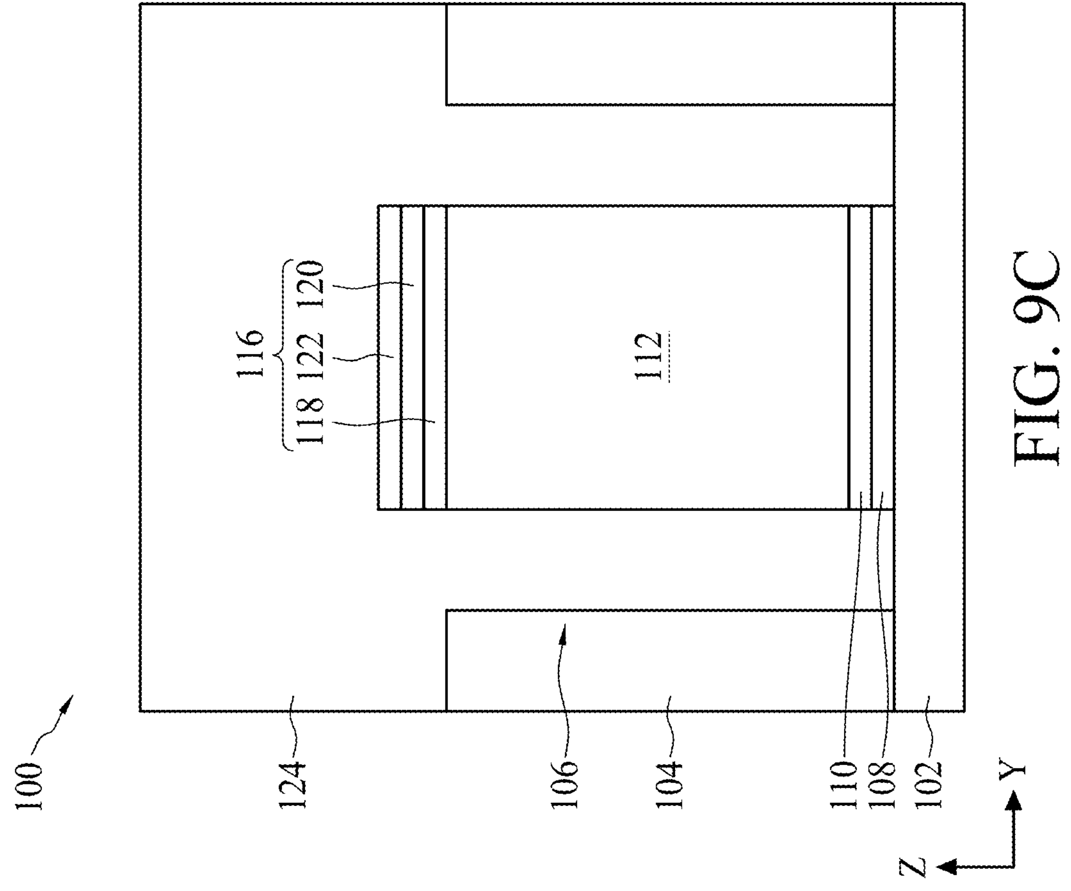

As shown in FIGS. 9A-9C, a dielectric material 124 is formed on the dielectric material 112, the tunable device 116, and in the trench 106 to fill the trench 106. In some embodiments, an etch stop layer may be first deposited on the surfaces of the DTR structure 100, and the dielectric material 124 is deposited on the etch stop layer. The dielectric material 124 may include any suitable dielectric material. In some embodiments, the dielectric material 124 includes the same material as the dielectric material 104.

Figures 10A, 10B:
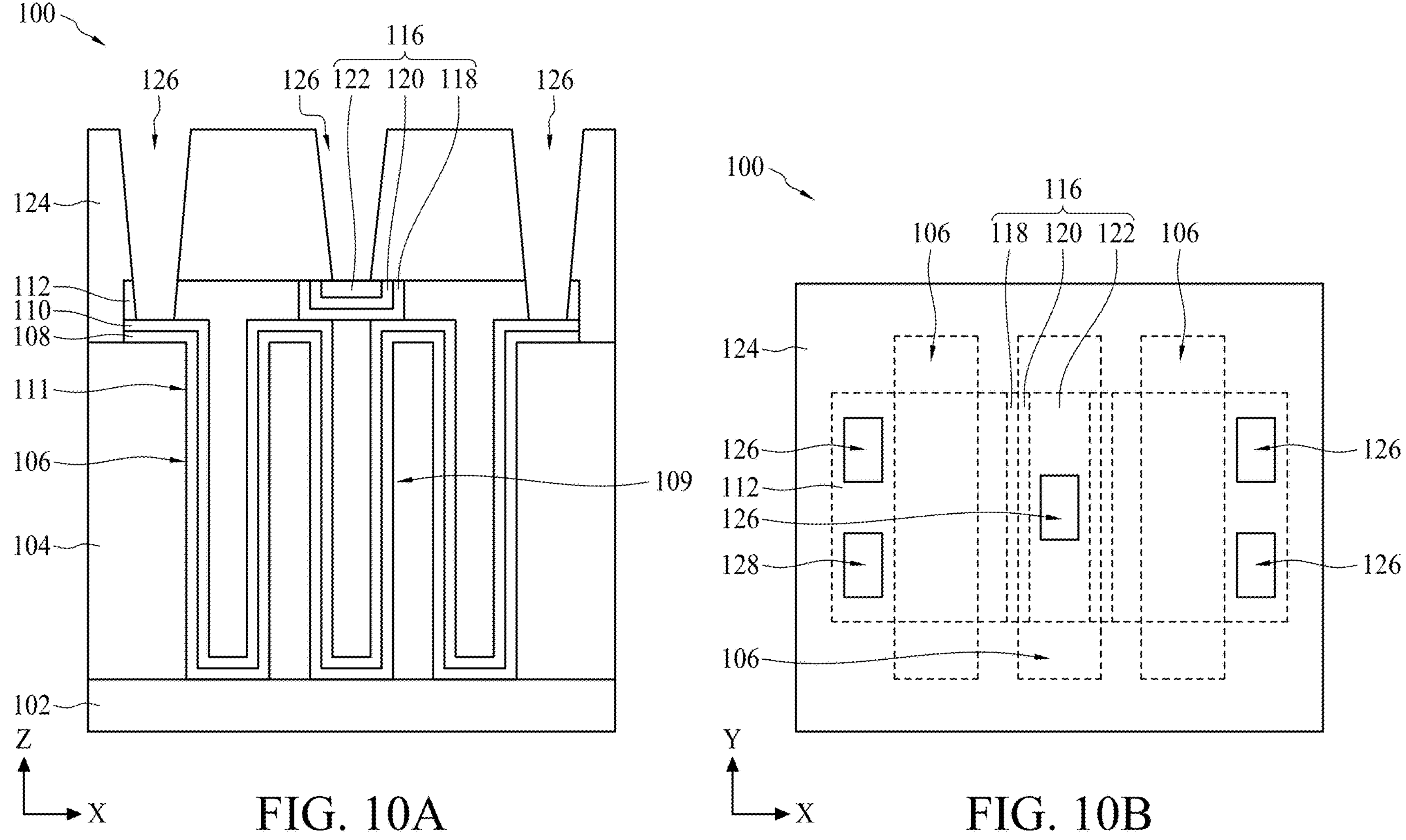
Figures 11A, 11B:
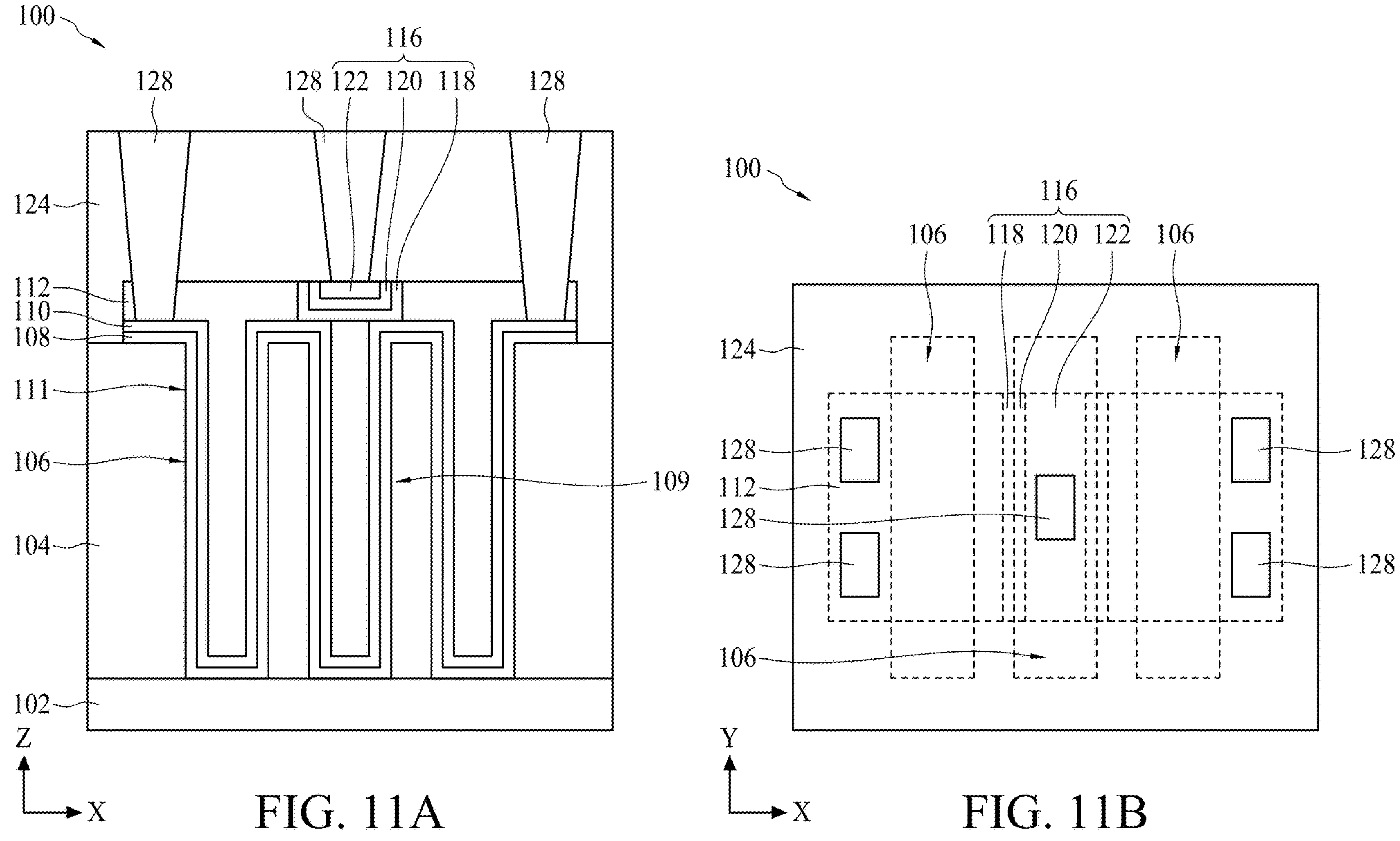

As shown in FIGS. 10A and 10B, openings 126 are formed in the dielectric materials 124, 112. In some embodiments, the opening 126 located over the first segment 109 of the DTR exposes the third layer 122 of the tunable device 116, and the openings 126 located over the second segment 111 of the DTR exposes portions of the second layer 110. Next, as shown in FIGS. 11A and 11B, conductive features 128 are formed in the openings 126. The conductive feature 128 includes an electrically conductive material, such as a metal. In some embodiments, the conductive feature 128 may be or include cobalt, tungsten, copper, ruthenium, aluminum, gold, silver, alloys thereof, the like, or a combination thereof, and may be deposited by CVD, ALD, PVD, or another deposition technique. As shown in FIG. 11A, in some embodiments, the conductive features 128 are in contact with the second layer 110 and the third layer 122. In some embodiments, the conductive feature 128 is electrically connected to the tunable device 116.

FIGS. 13A-20A are cross-sectional side views of various stages of manufacturing the DTR structure 100, and FIGS. 13B-20B are corresponding top views of the various stages of manufacturing the DTR structure 100 of FIGS. 13A-20A, in accordance with alternative embodiments. It is understood that additional operations can be provided before, during, and after processes shown by FIGS. 13A-20B, and some of the operations described below can be replaced or eliminated, for additional embodiments of the method. The order of the operations/processes is not limiting and may be interchangeable.

Figure 13B:
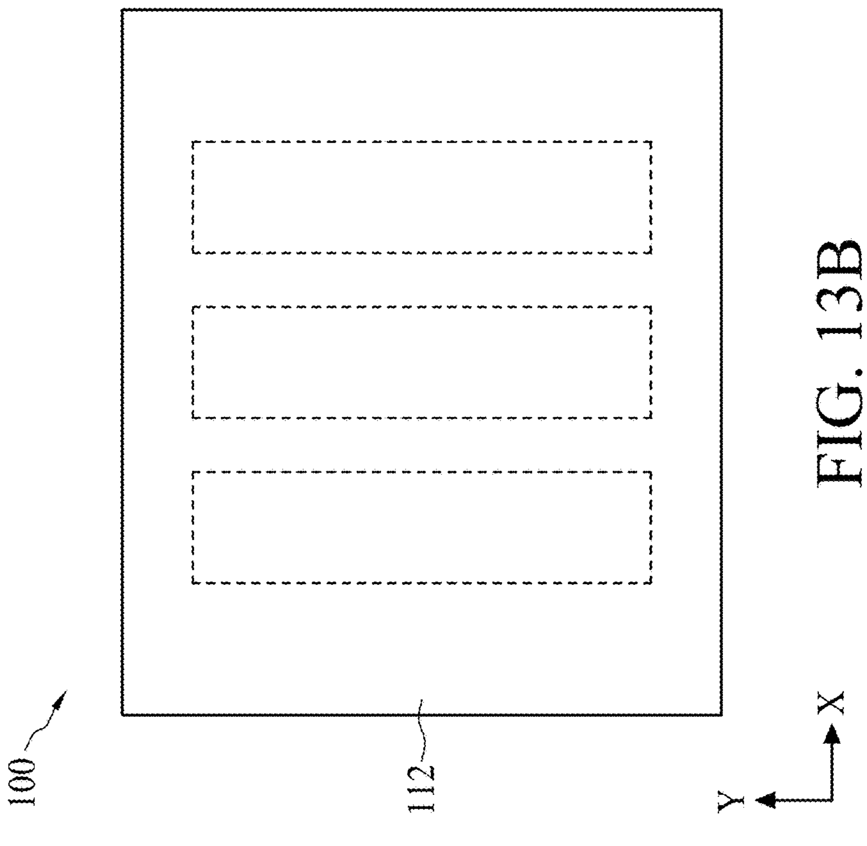
Figure 13A:
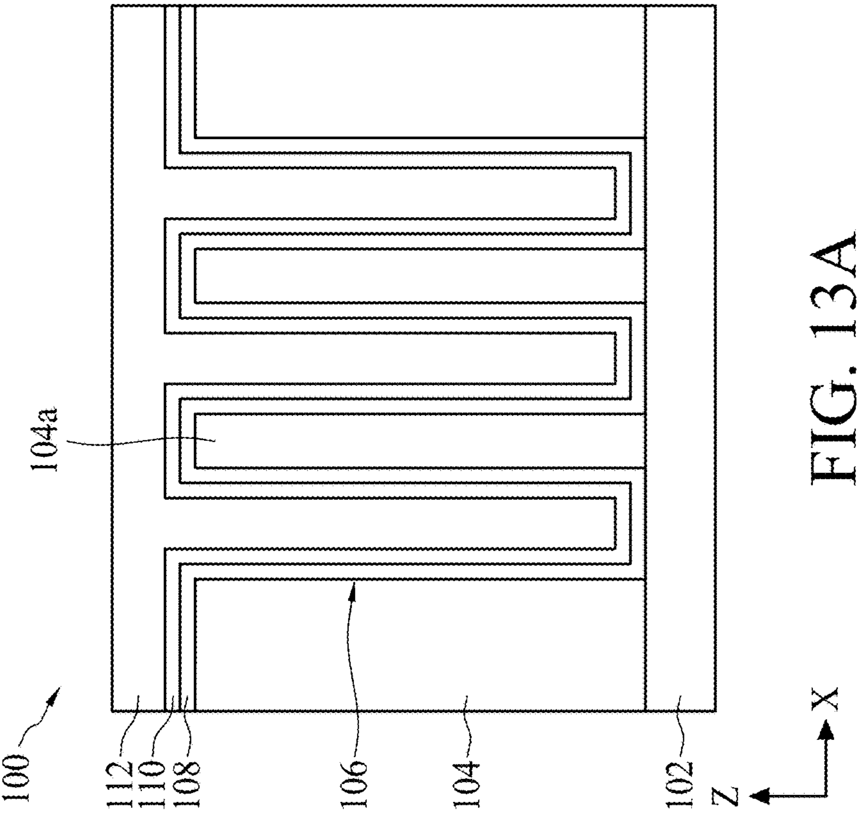
Figure 14B:
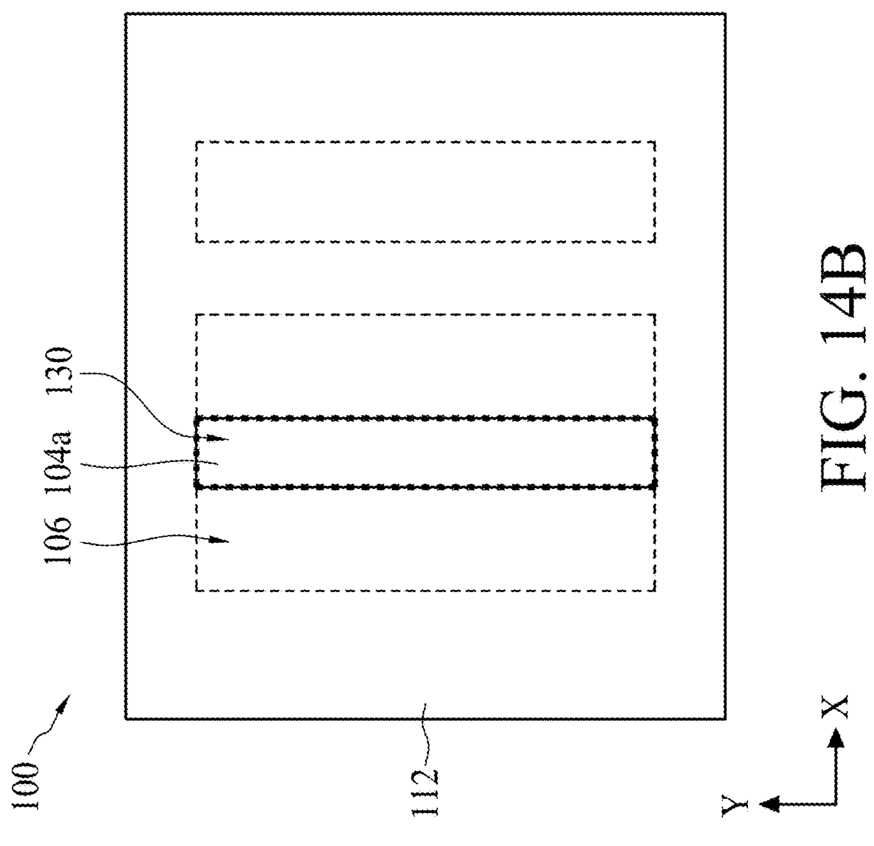
Figure 14A:
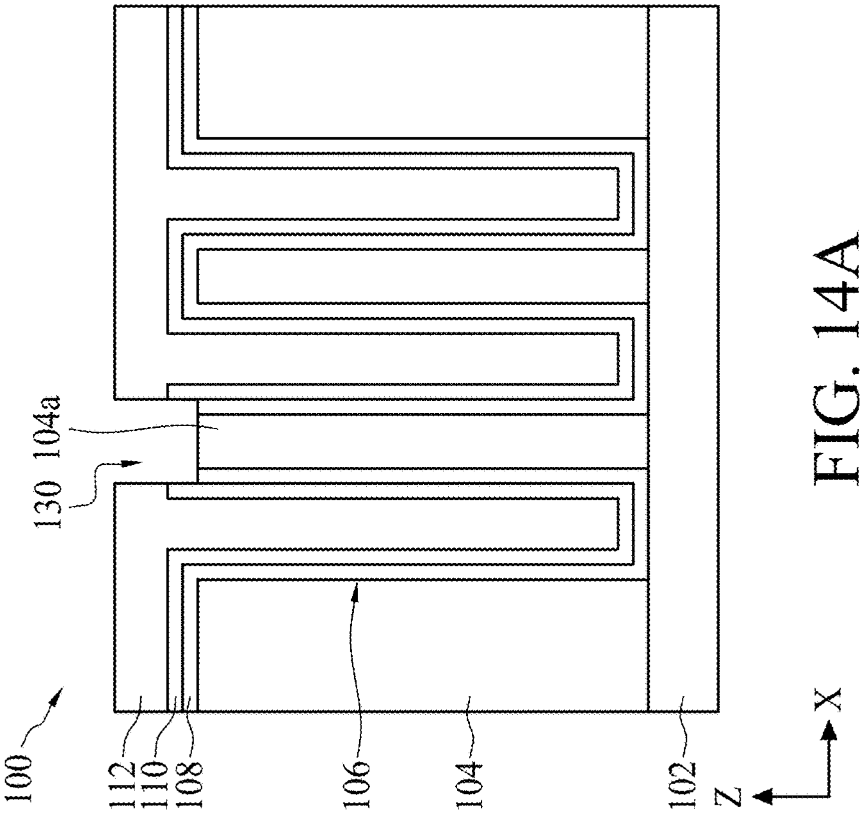

As shown in FIGS. 13A and 13B, the dielectric material 112 is formed on the second layer 110 and in the trenches 106. The DTR structure 100 shown in FIGS. 13A and 13B may be the same as the DTR structure 100 shown in FIGS. 4A and 4B. Next, as shown in FIGS. 14A and 14B, an opening 130 is formed in the dielectric material 112, the second layer 110, and the first layer 108, and the portion 104*a* of the dielectric material 104 is exposed. In some embodiments, the opening 130 is a trench. The opening 130 may have a dimension along the X direction the same as or substantially greater than the dimension of the portion 104*a* along the X direction and a dimension along the Y direction substantially the same as the dimension of the trench 106 along the Y direction, as shown in FIGS. 14A and 14B. In some embodiments, portions of the first layer 108 located on opposite sides of the portion 104*a* are exposed in the opening 130. The opening 130 may be formed by any suitable method. In some embodiments, the opening 130 is formed using photolithography and one or more etching processes. A resist layer (not shown) is patterned by the photolithography process, and the pattern of the resist layer is transferred to the dielectric material 112, the second layer 110, and the first layer 108 by the one or more etching processes to form the opening 130.

Figures 15A, 15B:
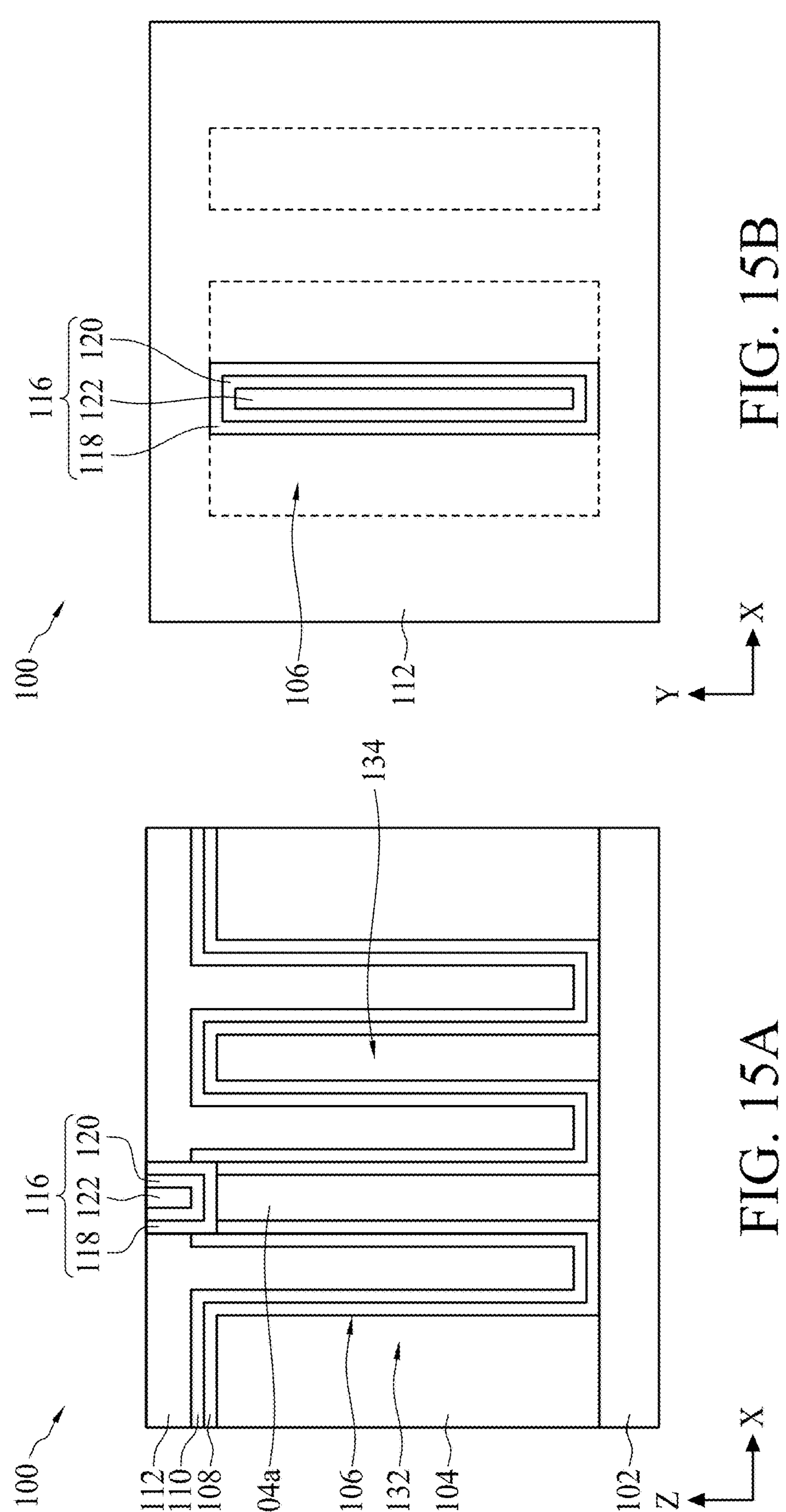

As shown in FIGS. 15A and 15B, the tunable device 116 is formed in the opening 130. The tunable device 116 may be formed by the same processes described in FIGS. 6A and 6B. As shown in FIG. 15A, the first layer 118 of the tunable device 116 is in contact with the portion 104*a* of the dielectric material 104, the first layer 108, and the second layer 110. In some embodiments, the tunable device 116 physically and electrically separates the DTR into a first segment 132 and a second segment 134. The first segment 132 may be upstream of the tunable device 116, and the second segment 134 may be downstream of the tunable device 116. The tunable device 116 helps to reduce the temperature dependency of the resistance of the DTR. In some embodiments, the third layer 122 functions as a control gate electrode and the first layer 118 functions as a channel. In some embodiments, the tunable device 116 is connected to the first and second segments 132, 134 of the DTR in series. In some embodiments, when the tunable device 116 is turned off, the first layer 118 is an insulator having a first resistance, and the resistance of the DTR equals the sum of the resistance of the first segment 132, the first resistance of the first layer 118, and the resistance of the second segment 134. When the tunable device 116 is partially turned on, a first voltage is applied to the tunable device 116, and the first layer 118 has a second resistance substantially smaller than the first resistance. The resistance of the DTR equals the sum of the resistance of the first segment 132, the second resistance, and the resistance of the second segment 134. When the tunable device 116 is fully turned on, a second voltage substantially greater than the first voltage is applied to the tunable device 116, and the first layer 118 has a third resistance substantially smaller than the second resistance. In some embodiments, the third resistance is zero. As a result, the resistance of the DTR equals the sum of the resistance of the first segment 132 and the resistance of the second segment 134. In some embodiments, the resistance of the DTR increases as temperature increases. The tunable device 116 can be turned on to reduce the resistance of first layer 118 of the tunable device 116 to keep the resistance of the DTR substantially constant as the temperature increases. The details of how the tunable device 116 tunes the resistance of the DTR at different temperatures are described in FIGS. 21A and 22B.

Figure 21B:
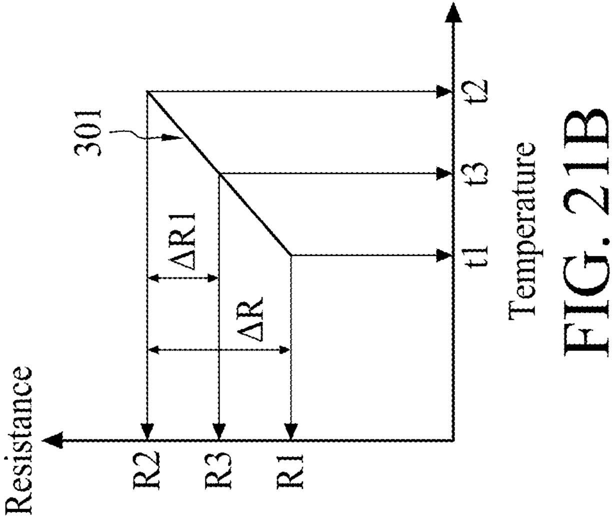
FIG. 21B is a chart showing a relationship between temperature and resistance of the deep trench resistor of FIG. 21A, in accordance with some embodiments.
Figure 21A:
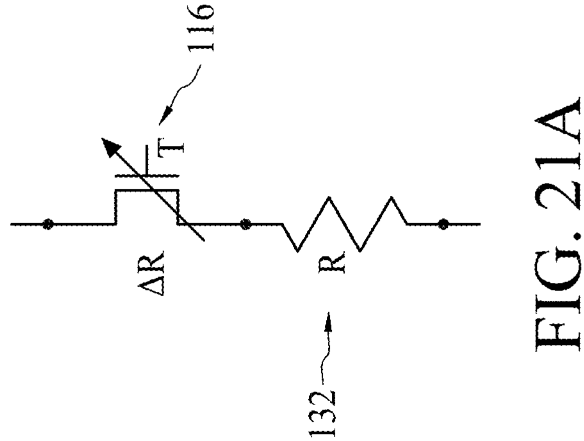
FIG. 21A is a circuit diagram of a deep trench resistor and a tunable device, in accordance with alternative embodiments.

FIG. 21A is a circuit diagram of the first segment 132 of the DTR and the tunable device 116 and FIG. 21B is the chart showing a relationship between temperature and resistance of the DTR. As shown in FIG. 21A, the tunable device 116 and the first segment 132 of the DTR are connected in series. The first segment 132 of the DTR has a resistance R at a temperature t1. The tunable device 116 (or the first layer 118 of the tunable device 116) has a resistance AR at the temperature t1. As shown in FIG. 21B, the temperature and the resistance of the first segment 132 of the DTR has a linear relationship 301. For example, at the temperature t1, the resistance R of the first segment 132 of the DTR is equal to R1. At a temperature t2, the resistance R of the first segment 132 of the DTR is equal to R2. At a temperature t3, the resistance R of the first segment 132 of the DTR is equal to R3. Thus, at temperature t1, the combined resistance of the first segment 132 and the tunable device 116 is equal to R1 plus AR, which is equal to R2, as shown in FIG. 21B. The tunable device 116 is turned off at temperature t1. At the temperature t3, the tunable device 116 is partially turned on, so the resistance of the first layer 118 of the tunable device 116 is equal to a percentage of AR, which is AR1. As a result, the combined resistance of the first segment 132 and the tunable device 116 is equal to R3 plus AR1, which is equal to R2. At the temperature t2, the tunable device 116 is completely turned on, so the resistance of the first layer 118 of the tunable device 116 is equal to zero. As a result, the combined resistance of the first segment 132 and the tunable device 116 is equal to R2. By utilizing the tunable device 116, the combined resistance of the first segment 132 of the DTR and the tunable device 116 remains substantially constant (e.g., at R2) as the temperature increases from t1 to t2.

Figures 16A, 16B:
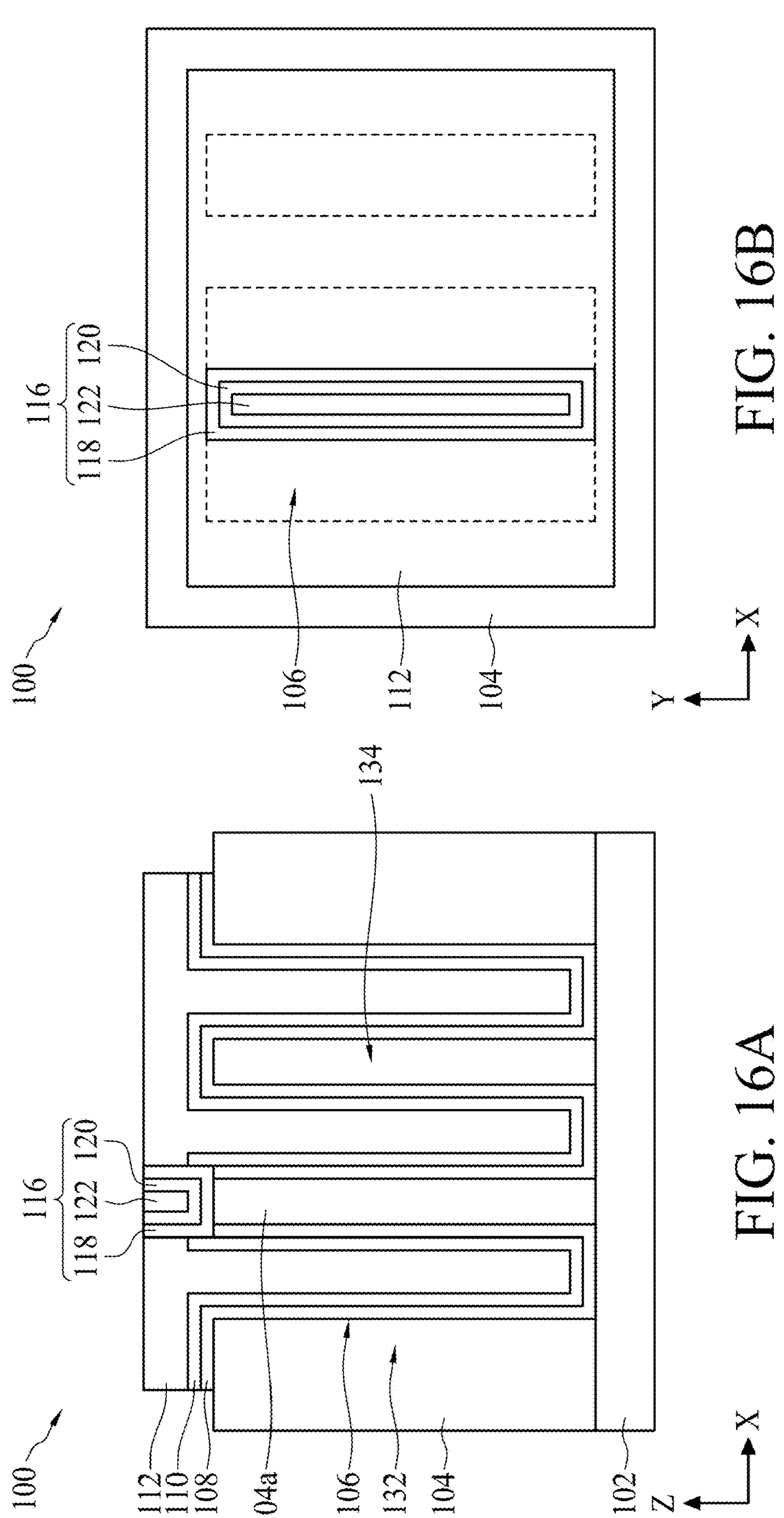
Figures 17A, 17B:
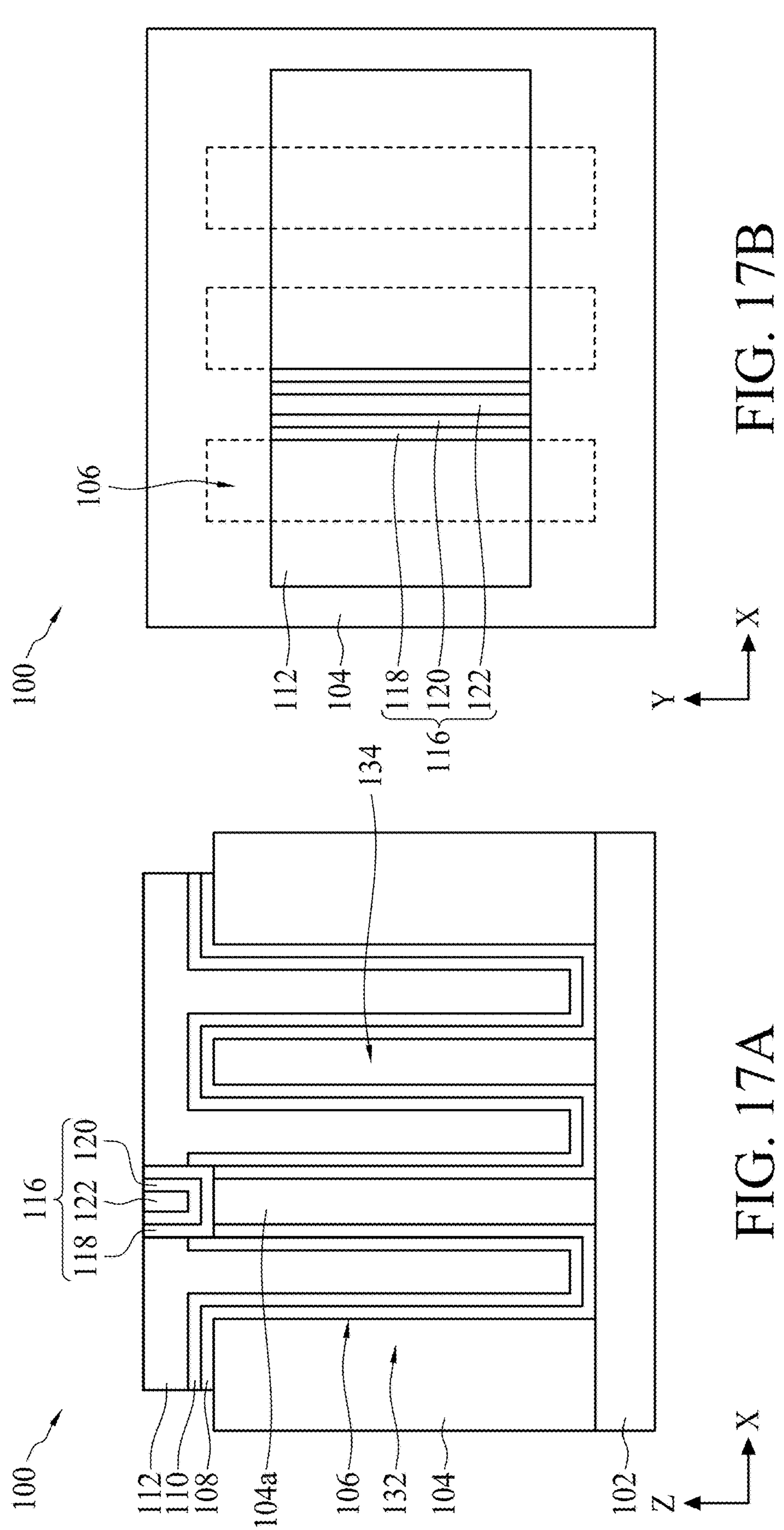

Referring to FIGS. 16A and 16B, after the formation of the tunable device 116, portions of the dielectric material 112, the second layer 110, and the first layer 108 are removed along the X direction. In other words, the dielectric material 112, the second layer 110, and the first layer 108 are recessed along the X direction. Next, as shown in FIGS. 17A and 17B, portions of the dielectric material 112, the second layer 110, the first layer 108, and the tunable device 116 are removed along the Y direction. In other words, the dielectric material 112, the second layer 110, the first layer 108, and the tunable device 116 are recessed along the Y direction. If the dielectric material 112, the second layer 110, the first layer 108, and the tunable device 116 are not recessed along the Y direction, a current may flow around the tunable device 116. As a result, the tunable device 116 cannot tune the resistance of the DTR. In some embodiments, the dimension of the tunable device 116 along the Y direction is substantially the same or greater than the dimension of the first and second layers 108, 110 along the Y direction. Similar to the DTR structure 100 shown in FIGS. 8B and 8C, portions of the dielectric material 112, the second layer 110, and the first layer 108 located in the trenches 106 may be removed. As a result, each trench 106 includes portions of the first layer 108, the second layer 110, and the dielectric material 112 located between two openings. In some embodiments, the recessing of the dielectric material 112, the second layer 110, and the first layer 108 along the X direction and the recessing of the dielectric material 112, the second layer 110, the first layer 108, and the tunable device 116 along the Y direction are performed by a single photolithography process with multiple etching processes.

Figures 18A, 18B:
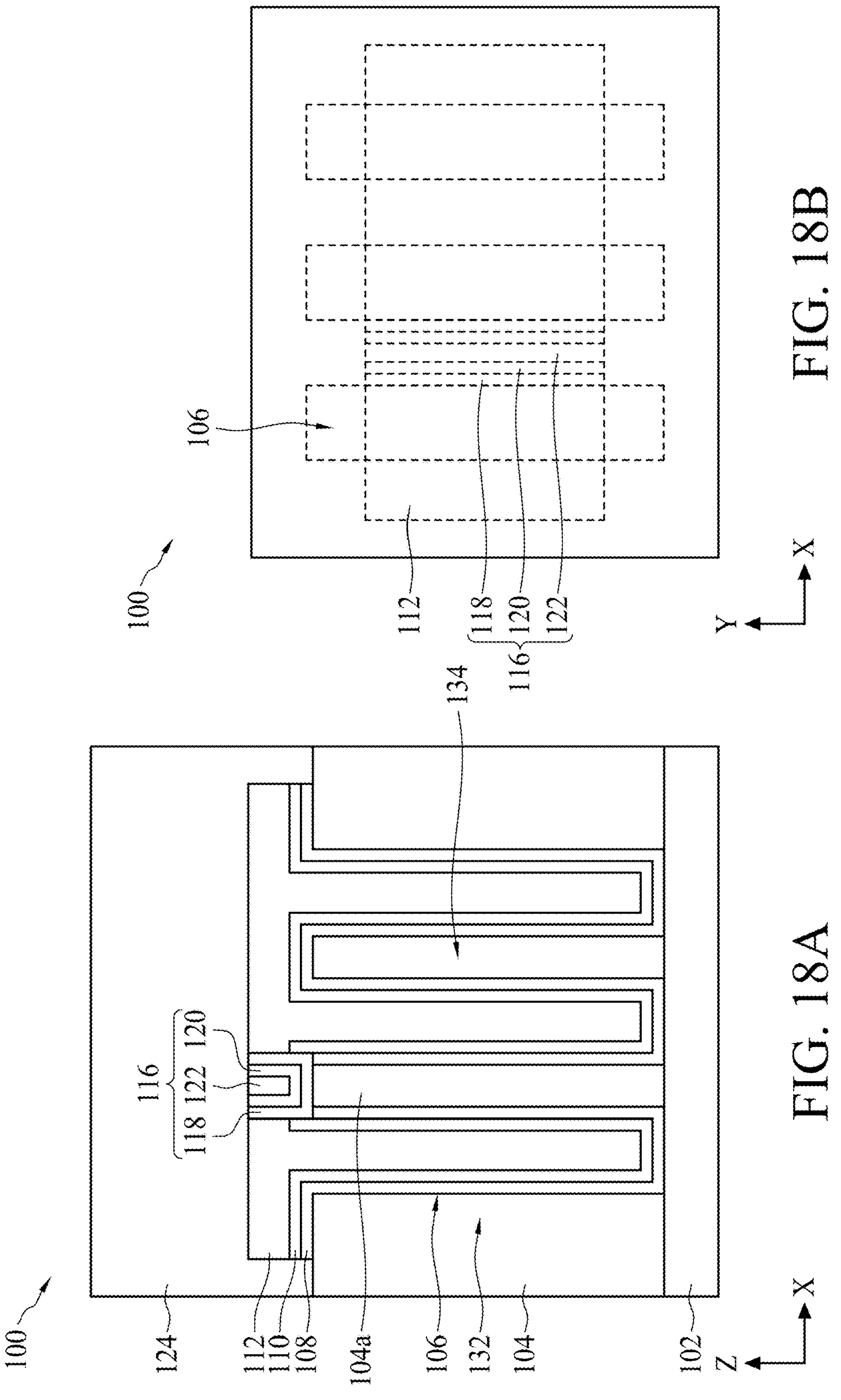
Figures 19A, 19B:
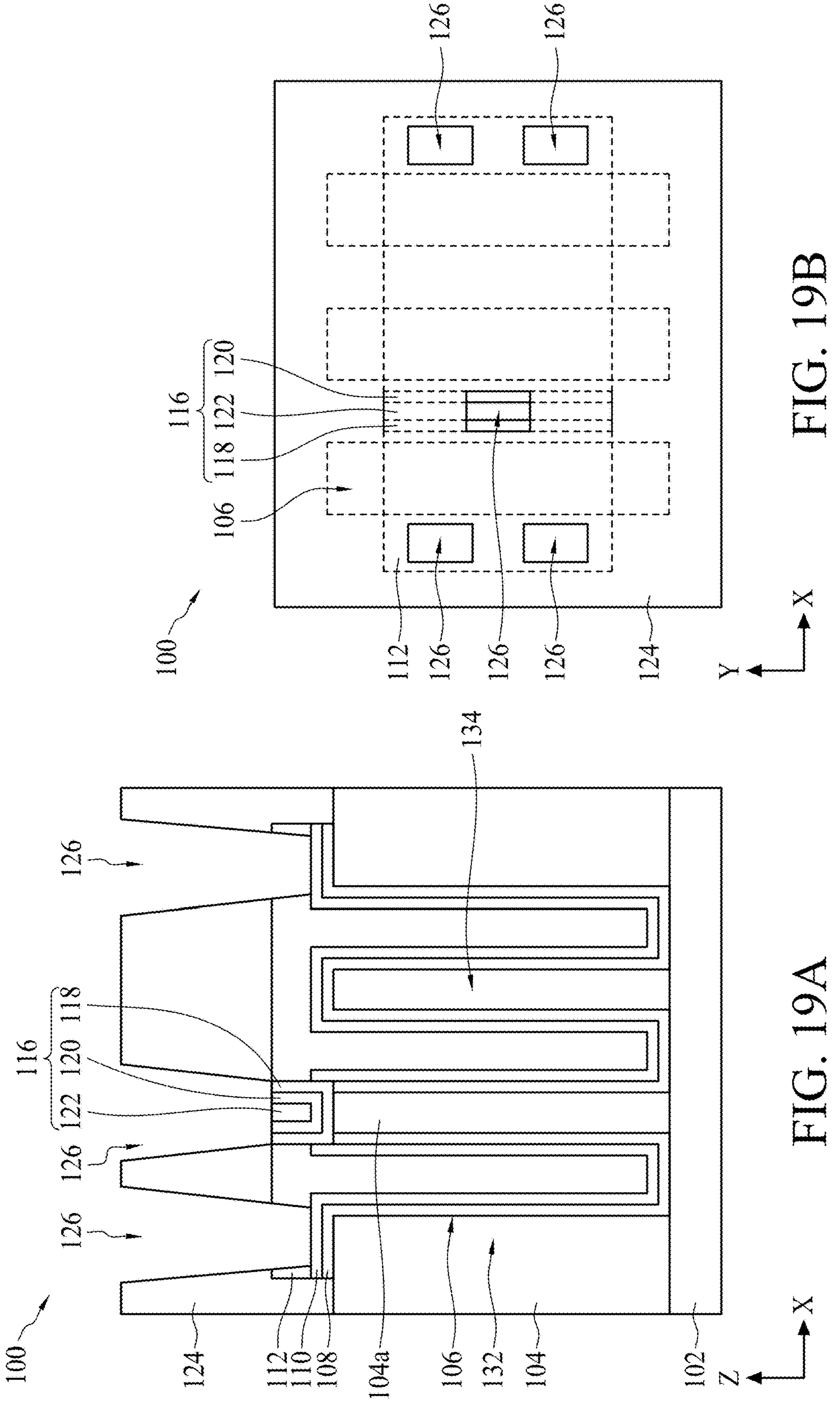
Figures 20A, 20B:
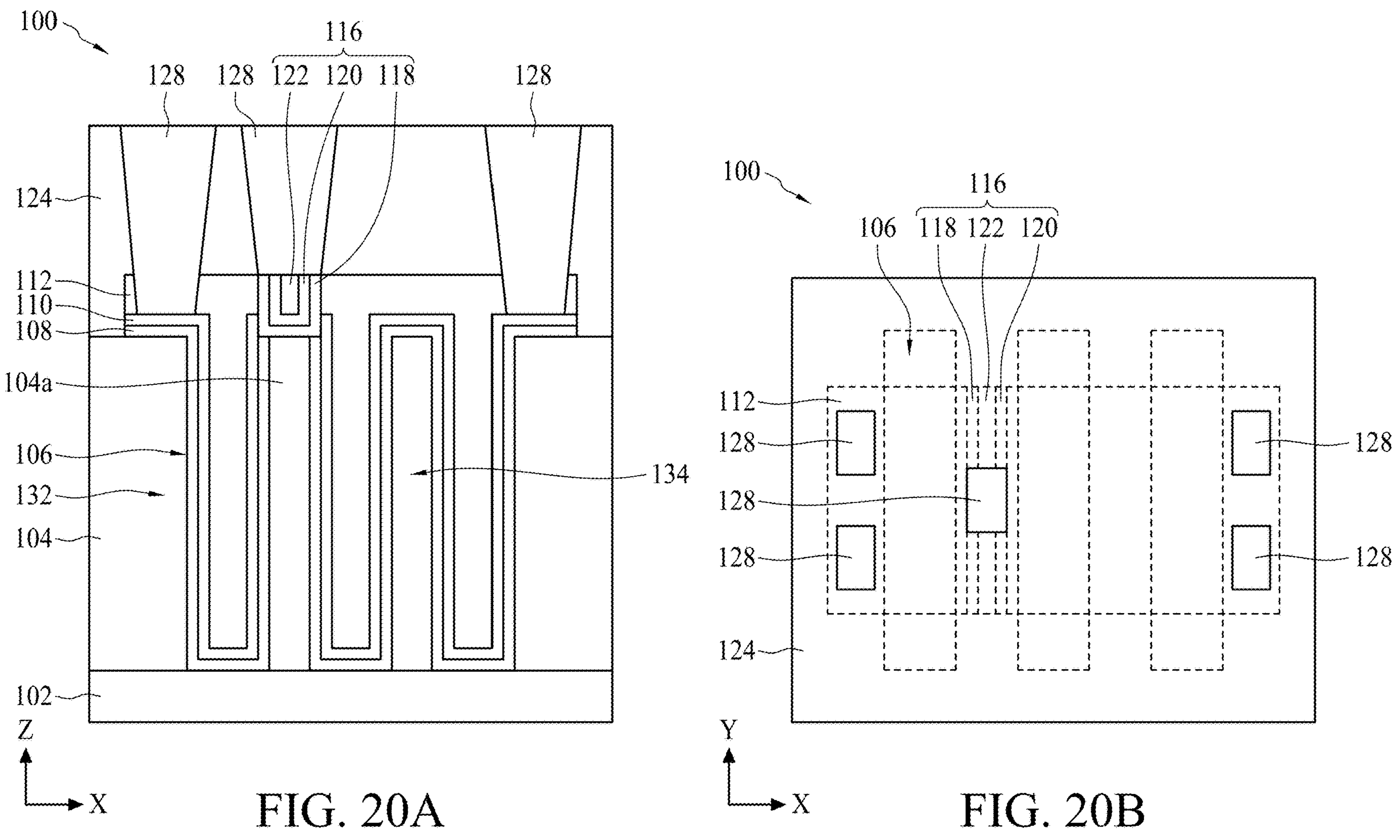

As shown in FIGS. 18A and 18B, the dielectric material 124 is formed on the dielectric material 112, the tunable device 116, and in the trench 106 to fill the trench 106. In some embodiments, an etch stop layer may be first deposited on the surfaces of the DTR structure 100, and the dielectric material 124 is deposited on the etch stop layer. As shown in FIGS. 19A and 19B, the openings 126 are formed in the dielectric materials 124, 112. In some embodiments, the openings 126 located over the first and second segments 132, 134 of the DTR exposes the second layer 110, and the opening 126 located over the tunable device 116 exposes the third layer 122. In some embodiments, the second layer 120 may also be exposed in the opening 126 located over the tunable device 116. Next, as shown in FIGS. 20A and 20B, the conductive features 128 are formed in the openings 126.

Figures 22A, 22B:
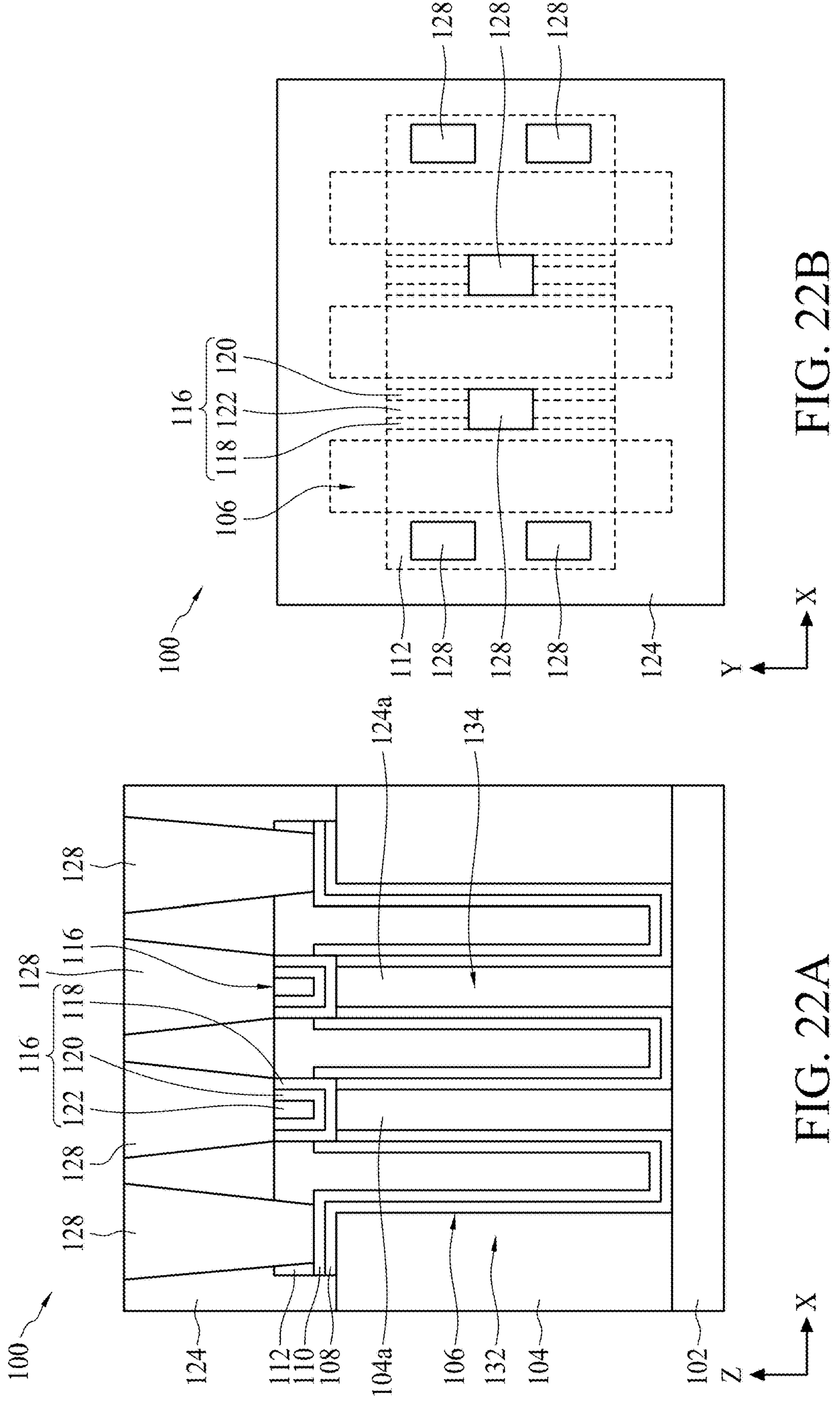
FIGS. 22A and 22B are various views of the deep trench resistor structure, in accordance with alternative embodiments.

FIGS. 22A and 22B are various views of the DTR structure 100, in accordance with alternative embodiments. In some embodiments, multiple tunable devices 116 are formed in the DTR to tune the resistance of the DTR. As shown in FIGS. 22A and 22B, a second tunable device 116 is formed on the portion 104*a*. In some embodiments, the DTR includes N trenches 106 and N−1 portions 104*a*, and a tunable device 116 is formed on each portion 104*a*. Thus, in some embodiments, the DTR includes N trenches 106, and the number of the tunable devices 116 ranges from about 1 to about N−1.

Figures 23A, 23B:
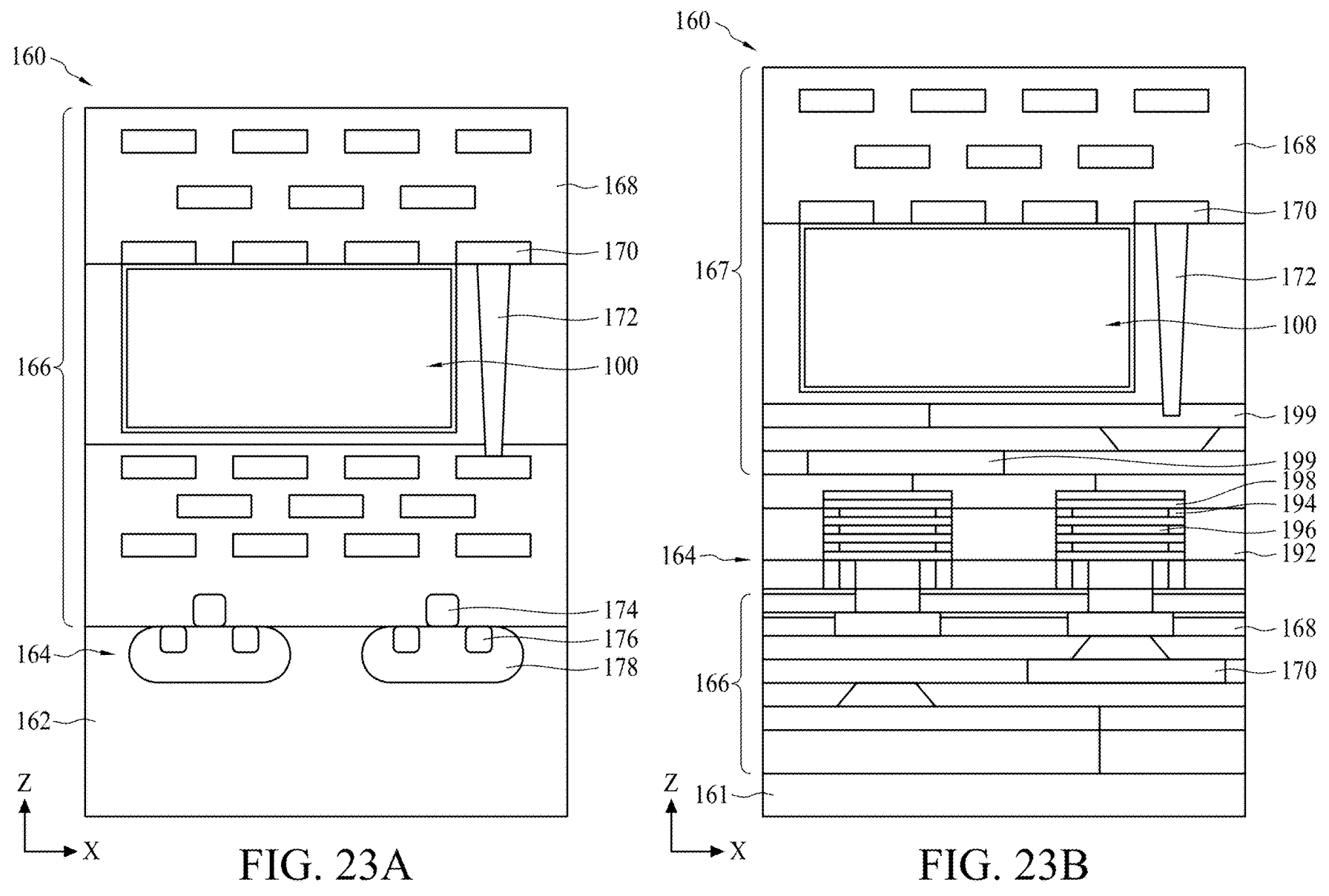

FIGS. 23A and 23B are cross-sectional side views of a semiconductor device structure 160 including the DTR structure 100, in accordance with some embodiments. As shown in FIG. 23A, in some embodiments, the semiconductor device structure 160 includes a substrate 162, devices 164 formed on the substrate 162, and an interconnect structure 166 formed over the substrate 162. The substrate 162 may be or include a bulk semiconductor substrate, a semiconductor-on-insulator (SOI) substrate, or the like, which may be doped (e.g., with a p-type or an n-type dopant) or undoped. In some embodiments, the semiconductor material of the substrate 162 may include an elemental semiconductor such as silicon (Si) or germanium (Ge); a compound semiconductor; an alloy semiconductor; or a combination thereof. In some embodiments, the substrate 162 includes Si, Ge, Ga, Zn, In, O, N, B, or P. The devices 164 may be any suitable devices, such as transistors, sensors, or diodes. In some embodiments, the devices 164 are logic devices, such as planar FETs, FinFETs, gate all around (GAA) FETs, 2D material devices, graphene devices. In some embodiments, the device 164 is a planar transistor including source/drain regions 176, a gate structure 174, and a channel region 178, as shown in FIG. 23A. In some embodiments, the source/drain regions 176 includes Si, Ge, C, P, B, or compounds thereof. The gate structure 174 may include a gate electrode layer and a gate dielectric layer. In some embodiments, the gate electrode layer includes polycrystalline silicon, amorphous silicon, Si, Ti, Ta, Al, W, N, Zn, In, Ga, Ge, C, or compounds thereof, and the gate dielectric layer includes SiO2, HfO, La, SiON, SiCON, Zn, Zr, or compounds thereof. In some embodiments, isolation structures may be formed in the substrate 162 to separate the devices 164. The isolation structures may be local oxidation of silicon (LOCOS), shallow trench isolation (STI), or deep trench isolation (DTI).

The interconnect structure 166 includes a plurality of intermetal dielectric (IMD) layers 168 and a plurality of conductive features 170 formed in the IMD layers 168. The DTR structure 100 may be located in the interconnect structure 166 and between vertically adjacent IMD layers 168. A conductive feature 172 extends through the IMD layer 168 in which the DTR structure 100 is located therein to electrically connect the conductive features 170 located in the IMD layers 168 above and below the DTR structure 100. In some embodiments, the tunable device 116 in the DTR structure 100 may be connected to a sensing circuit for pseudo TCR control.

FIG. 23B is a cross-sectional side view of the semiconductor device structure 160 including the DTR structure 100, in accordance with alternative embodiments. In some embodiments, the devices 164 are GAA FETs. The GAA FET may include source/drain regions 192, channel regions 196, and a gate structure 198 surrounding the channel regions 196. In some embodiments, the semiconductor device structure 160 includes the interconnect structure 166 formed on a front side of the substrate 162 (which is subsequently removed) and a backside interconnect structure 167 formed on a back side of the substrate 162. The interconnect structure 166 may be bonded to a substrate 161. In some embodiments, the DTR structure 100 is formed in the backside interconnect structure 167. The backside interconnect structure 167 also includes a plurality of IMD layers 168 and a plurality of conductive features 170 formed in the IMD layers 168. The DTR structure 100 may be formed between vertically adjacent IMD layers 168 in the backside interconnect structure 167. The conductive feature 172 extends through the IMD layer 168 in which the DTR structure 100 is located therein to electrically connect the conductive features 170 located in the IMD layers 168 above and below the DTR structure 100. In some embodiments, the backside interconnect structure 167 includes one or more backside power rails 199 for providing power to the devices 164 from the backside. The DTR structure 100 may be disposed over the backside power rails 199, as shown in FIG. 23B. In some embodiments, the tunable device 116 in the DTR structure 100 may be connected to a sensing circuit for pseudo TCR control.

Embodiments of the present disclosure provide the DTR device structure 100 and the methods of forming the same. In some embodiments, the DTR structure 100 includes a DTR including a layer 108, a layer 110, or a combination of the layers 108, 110. A tunable device 116 may be formed with a segment of the DTR in parallel or in series. Some embodiments may achieve advantages. For example, the tunable device 116 can tune the resistance of the segment of the DTR to achieve pseudo TCR control.

An embodiment is a DTR structure. The structure includes a first trench located in a first dielectric material, a first layer disposed over the first dielectric material, a second layer disposed on the first layer, a second dielectric material disposed over the second layer, and a tunable device in contact with the first layer. The tunable device includes a semiconductor-containing layer in contact with the first layer, a dielectric layer disposed on the semiconductor-containing layer, and a metal-containing layer disposed on the dielectric layer.

Another embodiment is a DTR structure. The structure includes first and second trenches located in a first dielectric material, and the first and second trenches are separated by a first portion of the first dielectric material, a first layer disposed on the first dielectric material, a second layer disposed on the first layer, a second dielectric material disposed on the second layer, a third dielectric material surrounding and in contact with the first layer, the second layer, and the second dielectric material, a first tunable device disposed in the second dielectric material in contact with the first layer, and a first conductive feature disposed in the third dielectric material. The first conductive feature is electrically connected to the first tunable device.

A further embodiment is a method. The method includes forming at least one trench in a first dielectric material, depositing a first layer over the first dielectric material, depositing a second layer on the first layer, depositing a second dielectric material on the second layer, and forming a tunable device in contact with the second layer. The forming the tunable device includes depositing a semiconductor-containing layer in contact with the second layer, depositing a dielectric layer on the semiconductor-containing layer, and depositing a metal-containing layer on the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A deep trench resistor structure, comprising:
- a first trench located in a first dielectric material;
- a first layer disposed over the first dielectric material;
- a second layer disposed on the first layer;
- a second dielectric material disposed over the second layer; and
- a tunable device in contact with the first layer, wherein the tunable device comprises:
  - a semiconductor-containing layer in contact with the first layer;
  - a dielectric layer disposed on the semiconductor-containing layer; and
  - a metal-containing layer disposed on the dielectric layer.

2. The deep trench resistor structure of claim 1, wherein the first layer comprises a metal and the second layer comprises a semiconductor.

3. The deep trench resistor structure of claim 1, wherein the first and second layers and the second dielectric material are disposed in the first trench.

4. The deep trench resistor structure of claim 3, wherein the tunable device is disposed in the second dielectric material over the first trench.

5. The deep trench resistor structure of claim 1, further comprising a second trench formed in the first dielectric material.

6. The deep trench resistor structure of claim 5, wherein the first and second trenches are separated by a portion of the first dielectric material.

7. The deep trench resistor structure of claim 6, wherein the tunable device is disposed over the portion of the first dielectric material.

8. The deep trench resistor structure of claim 7, wherein the tunable device is in contact with the portion of the first dielectric material.

9. A deep trench resistor structure, comprising:
- first and second trenches located in a first dielectric material, wherein the first and second trenches are separated by a first portion of the first dielectric material;
- a first layer disposed on the first dielectric material;
- a second layer disposed on the first layer;
- a second dielectric material disposed on the second layer;
- a third dielectric material surrounding and in contact with the first layer, the second layer, and the second dielectric material;
- a first tunable device disposed in the second dielectric material in contact with the first layer; and
- a first conductive feature disposed in the third dielectric material, wherein the first conductive feature is electrically connected to the first tunable device.

10. The deep trench resistor structure of claim 9, wherein the first tunable device comprises a semiconductor-containing layer, a dielectric layer disposed on the semiconductor-containing layer, and a metal-containing layer disposed on the dielectric layer.

11. The deep trench resistor structure of claim 9, wherein the first tunable device is disposed on the first portion of the first dielectric material.

12. The deep trench resistor structure of claim 11, further comprising a third trench disposed in the first dielectric material, wherein the third trench and the second trench are separated by a second portion of the first dielectric material.

13. The deep trench resistor structure of claim 12, further comprising a second tunable device disposed on the second portion of the first dielectric material.

14. The deep trench resistor structure of claim 9, wherein the first tunable device is disposed over the second trench.

15. The deep trench resistor structure of claim 14, further comprising a second conductive feature disposed over the first dielectric material, wherein the second conductive feature is in contact with the second layer.

16. The deep trench resistor structure of claim 15, further comprising a third conductive feature disposed in the third dielectric material, wherein the second and third conductive features are aligned in a first direction.

17. The deep trench resistor structure of claim 16, further comprising a fourth conductive feature disposed in the third dielectric material, wherein the second and fourth conductive features are aligned in a second direction substantially perpendicular to the first direction.

18. A method, comprising:

forming at least one trench in a first dielectric material;

depositing a first layer over the first dielectric material;

depositing a second layer on the first layer;

depositing a second dielectric material on the second layer; and forming a tunable device in contact with the second layer, comprising:

depositing a semiconductor-containing layer in contact with the second layer;

depositing a dielectric layer on the semiconductor-containing layer; and depositing a metal-containing layer on the dielectric layer.

19. The method of claim 18, further comprising forming an opening in the second dielectric material, wherein the tunable device is formed in the opening.

20. The method of claim 19, wherein the opening extends through the second layer.

* * * * *